US009208022B2

(12) United States Patent
Leem et al.

(10) Patent No.: US 9,208,022 B2
(45) Date of Patent: Dec. 8, 2015

(54) TECHNIQUES FOR ADAPTIVE MOVING READ REFERENCES FOR MEMORY CELL READ ERROR RECOVERY

(71) Applicant: Intel Corporation, Santa Clara, CA (US)

(72) Inventors: Lark-Hoon Leem, East Palo Alto, CA (US); Kiran Pangal, Fremont, CA (US); Xin Guo, San Jose, CA (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 14/499,003

(22) Filed: Sep. 26, 2014

(65) Prior Publication Data

US 2015/0019922 A1 Jan. 15, 2015

Related U.S. Application Data

(63) Continuation-in-part of application No. 13/976,463, filed as application No. PCT/US2012/031261 on Mar. 29, 2012.

(51) Int. Cl.

| | |
|---|---|
| ***G06F 11/10*** | (2006.01) |
| ***G06F 11/07*** | (2006.01) |
| ***G06F 11/00*** | (2006.01) |
| ***G11C 29/00*** | (2006.01) |
| ***G11C 11/56*** | (2006.01) |
| ***G11C 16/34*** | (2006.01) |

(52) U.S. Cl.

CPC .......... *G06F 11/1048* (2013.01); *G06F 11/076* (2013.01); *G11C 11/5642* (2013.01); *G11C 16/3418* (2013.01); *G11C 16/3495* (2013.01); *G11C 29/789* (2013.01)

(58) Field of Classification Search

None

See application file for complete search history.

(56) References Cited

U.S. PATENT DOCUMENTS

| | | | | |
|---|---|---|---|---|
| 6,963,505 | B2 * | 11/2005 | Cohen | 365/185.03 |
| 6,992,932 | B2 * | 1/2006 | Cohen | 365/185.2 |
| 2010/0162084 | A1 * | 6/2010 | Coulson et al. | 714/773 |
| 2012/0163074 | A1 * | 6/2012 | Franca-Neto et al. | 365/185.2 |

* cited by examiner

*Primary Examiner* — Justin R Knapp

(74) *Attorney, Agent, or Firm* — Kacvinsky Daisak Bluni PLLC

(57) ABSTRACT

Examples are given for generating or providing a moving read reference (MRR) table for recovering from a read error of non-volatile memory included in a storage device. In some examples, priorities may be adaptively assigned to entries included in the MRR table. The entries may be ordered for use based on the assigned priorities. In other examples, the MRR table may be ordered for use such that entries with a single MRR value for each read reference value may be used first over entries having multiple MRR values for each read reference value. For these other examples, the MRR table may be adaptively reordered based on which entries were successful or unsuccessful in recovering from a read error but may still be arranged to have single MRR value entries used first for use to recover from another read error.

23 Claims, 14 Drawing Sheets

PD 410
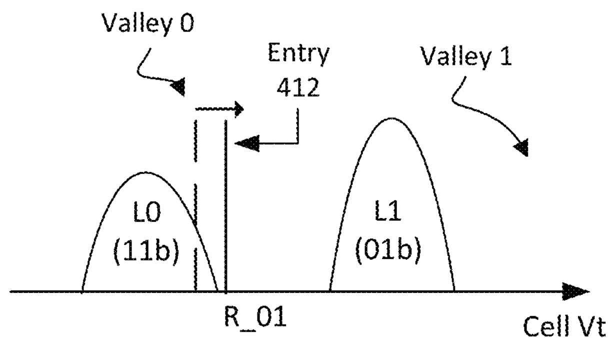
PD 420
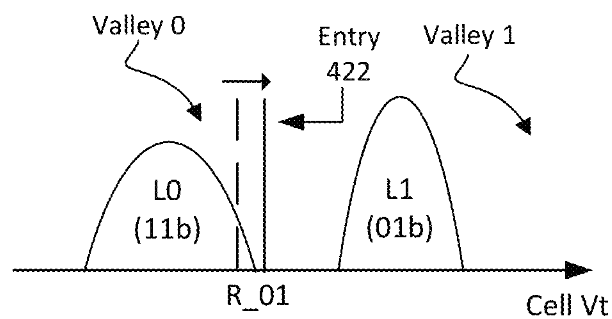
PD 430
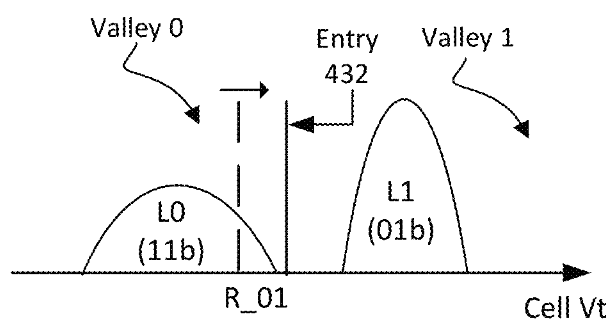
FIG. 4

MRR Table 610
(Count 510)

| Entry Name | Priority | Order | R_01 | R_00 | R_10 |
|---|---|---|---|---|---|
| Factory Default | 1.0 | 1 | +50mv | +50mv | -50mv |
| Partial Block Program | 0.9 | 2 | +200mv | +200mv | +200mv |
| PD 410 | 0.8 | 3 | +100mv | 0 | 0 |
| PD 420 | 0.7 | 4 | +250mv | 0 | 0 |
| PD 430 | 0.6 | 5 | +500mv | 0 | 0 |
| ICL1 | 0.5 | 6 | 0 | 0 | -100mv |
| ICL2 | 0.4 | 7 | 0 | 0 | -250mv |
| ICL3 | 0.3 | 8 | 0 | 0 | -400mv |

MRR Table 620
(Count 520)

| Entry Name | Priority | Order | R_01 | R_00 | R_10 |
|---|---|---|---|---|---|
| Factory Default | 0.9 | 2 | +50mv | +50mv | -50mv |
| Partial Block Program | 0.8 | 3 | +200mv | +200mv | +200mv |
| PD 410 | 1 | 1 | +100mv | 0 | 0 |
| PD 420 | 0.7 | 4 | +250mv | 0 | 0 |
| PD 430 | 0.6 | 5 | +500mv | 0 | 0 |
| ICL1 | 0.5 | 6 | 0 | 0 | -100mv |
| ICL2 | 0.4 | 7 | 0 | 0 | -250mv |
| ICL3 | 0.3 | 8 | 0 | 0 | -400mv |

MRR Table 630
(Count 530)

| Entry Name | Priority | Order | R_01 | R_00 | R_10 |
|---|---|---|---|---|---|
| Factory Default | 0.9 | 2 | +50mv | +50mv | -50mv |
| Partial Block Program | 0.6 | 5 | +200mv | +200mv | +200mv |
| PD 410 | 0.8 | 3 | +100mv | 0 | 0 |
| PD 420 | 1.0 | 1 | +250mv | 0 | 0 |
| PD 430 | 0.7 | 4 | +500mv | 0 | 0 |
| ICL1 | 0.5 | 6 | 0 | 0 | -100mv |
| ICL2 | 0.4 | 7 | 0 | 0 | -250mv |
| ICL3 | 0.3 | 8 | 0 | 0 | -400mv |

MRR Table 640
(Count 540)

| Entry Name | Priority | Order | R_01 | R_00 | R_10 |
|---|---|---|---|---|---|
| Factory Default | 0.9 | 2 | +50mv | +50mv | -50mv |
| Partial Block Program | 0.7 | 4 | +200mv | +200mv | +200mv |
| PD 410 | 0.6 | 5 | +100mv | 0 | 0 |
| PD 420 | 0.8 | 3 | +250mv | 0 | 0 |
| PD 430 | 1.0 | 1 | +500mv | 0 | 0 |
| ICL1 | 0.5 | 6 | 0 | 0 | -100mv |
| ICL2 | 0.4 | 7 | 0 | 0 | -250mv |
| ICL3 | 0.3 | 8 | 0 | 0 | -400mv |

FIG. 6

MRR Comparison Table 710
(Other Non-Volatile Memory)

| Entry Name | Priority | Order | R_01 | R_00 | R_10 | Success % |
|---|---|---|---|---|---|---|
| Factory Default | 0.3 | 8 | +50mv | +50mv | -50mv | 10 |
| Partial Block Program | 0.8 | 3 | +200mv | +200mv | +200mv | 70 |
| PD 1 | 0.4 | 7 | +100mv | 0 | 0 | 15 |
| PD 2 | 0.6 | 5 | +250mv | 0 | 0 | 18 |
| PD 3 | 0.5 | 6 | +500mv | 0 | 0 | 25 |
| ICL1 | 1.0 | 1 | 0 | 0 | -100mv | 85 |
| ICL2 | 0.9 | 2 | 0 | 0 | -250mv | 75 |
| ICL3 | 0.7 | 4 | 0 | 0 | -400mv | 65 |

MRR Table 720
(Non-Volatile Memory 130)

| Entry Name | Priority | Order | R_01 | R_00 | R_10 |
|---|---|---|---|---|---|
| Factory Default | 0.3 | 8 | +50mv | +50mv | -50mv |
| Partial Block Program | 0.8 | 3 | +200mv | +200mv | +200mv |
| PD 410 | 0.4 | 7 | +100mv | 0 | 0 |
| PD 420 | 0.6 | 5 | +250mv | 0 | 0 |
| PD 430 | 0.5 | 6 | +500mv | 0 | 0 |
| ICL1 | 1.0 | 1 | 0 | 0 | -100mv |
| ICL2 | 0.9 | 2 | 0 | 0 | -250mv |
| ICL3 | 0.7 | 4 | 0 | 0 | -400mv |

FIG. 7

MRR Table 800

| Entry Name | Priority | Order | R_01 | R_00 | R_10 |
| --- | --- | --- | --- | --- | --- |
| Factory Default | 0.7 | 4 | +50mv | +50mv | -50mv |
| Partial Block Program | 0.6 | 5 | +200mv | +200mv | +200mv |
| PD 410 | 0.5 | 6 | +100mv | 0 | 0 |
| PD 420 | 0.4 | 7 | +250mv | 0 | 0 |
| PD 430 | 0.3 | 8 | +500mv | 0 | 0 |
| ICL1 | 1.0 | 1 | 0 | 0 | -100mv |
| ICL2 | 0.9 | 2 | 0 | 0 | -250mv |
| ICL3 | 0.8 | 3 | 0 | 0 | -400mv |

FIG. 8

TECHNIQUES FOR ADAPTIVE MOVING READ REFERENCES FOR MEMORY CELL READ ERROR RECOVERY

RELATED CASE

This application is a continuation-in-part claiming the benefit of, and priority to, previously filed U.S. patent application Ser. No. 13/976,463 filed on Jun. 26, 2013, entitled "Adaptive Moving Read Reference for Memory Cells", which is a National Stage Entry of international patent application PCT/US2012/031261 filed on Mar. 29, 2012, both applications hereby incorporated by reference in their entirety.

TECHNICAL FIELD

Examples described herein are generally related to recovery techniques for memory cell read error recovery for non-volatile memory.

BACKGROUND

Various types of non-volatile memory such as NAND memory typically utilize various error correction schemes to search for improved read reference voltages responsive to read errors. Read failures may originate from numerous error mechanisms and different usage models. These error mechanisms and usage models may alter memory cell threshold voltage (Vt) distributions. As a result of altering Vt distributions, it generally helps to move read reference voltage values and retry reading the memory cells. This movement of the read reference is referred to as Moving Read Reference (MRR). However, MRR schemes can involve numerous attempts to move read reference before an Error Correction Code (ECC) correctable read reference is found. In order to prevent a large number of re-reads, an MRR table having a fixed number of entries implemented in a fixed order or sequence may be used. Once all the MRR table entries have been used in the fixed sequence and an ECC correctable read reference is not found, other error recovery schemes may be implemented and/or the memory cell may be deemed as unreadable.

BRIEF DESCRIPTION OF THE DRAWINGS

FIG. 4 illustrates example program disturbs for a portion of multi-level cell programming distributions.

FIG. 6 illustrates example count-based moving read reference (MRR) tables.

FIG. 7 illustrates an example comparison MRR table for providing an MRR table.

FIG. 8 illustrates an example MRR table updated based on bit-flip information.

DETAILED DESCRIPTION

As contemplated in the present disclosure, a large number of re-reads of non-volatile memory following a read failure may occur unless an MRR table having a fixed number of entries implemented in a fixed order is used. However, despite the simplicity of a fixed MRR table, the fixed nature of this type of table may leave out a number of possible moving read reference values. These excluded read reference values may lead to prematurely and/or incorrectly labeling memory cells as unreadable. Also, a fixed MRR table implemented in a fixed order may include repeated use of MRR table entries that are irrelevant and will be used even if these entries are unlikely to result in an ECC correctable read reference.

In some examples, techniques are implemented for adaptively generating or providing an MRR table for recovering from a read error of one or more memory cells of a non-volatile memory (e.g., NAND memory) included in a storage device (e.g., a solid-state drive (SSD)). For these examples, the MRR table may include a first and a second portion of entries. The first portion may include entries each having a single MRR value for each read reference value. The second portion including one or more entries each having multiple MRR values (e.g., associated with corrective read (CR) or soft-bit read (SBR) for each read reference value. The MRR table entries may be ordered such that at least one entry of the first portion will be used before one or more entries of the second portion when the MRR table is used to recover from a read error of the one or more memory cells. Also, for these examples, one or more entries of the MRR table may be used to recover from one or more read errors of the one or more memory cells. A first count for a first entry of the first portion may be decremented based on the entry having a worst error correction capability relative to one or more other entries of the first portion. The MRR table entries of the first portion may then be reordered such that a given entry of the first portion having a highest count will be first from among the first portion of entries to be used to recover from another read error of the one or more memory cells. The given entry may also be used before any of the one or more entries of the second portion.

Figure 1:
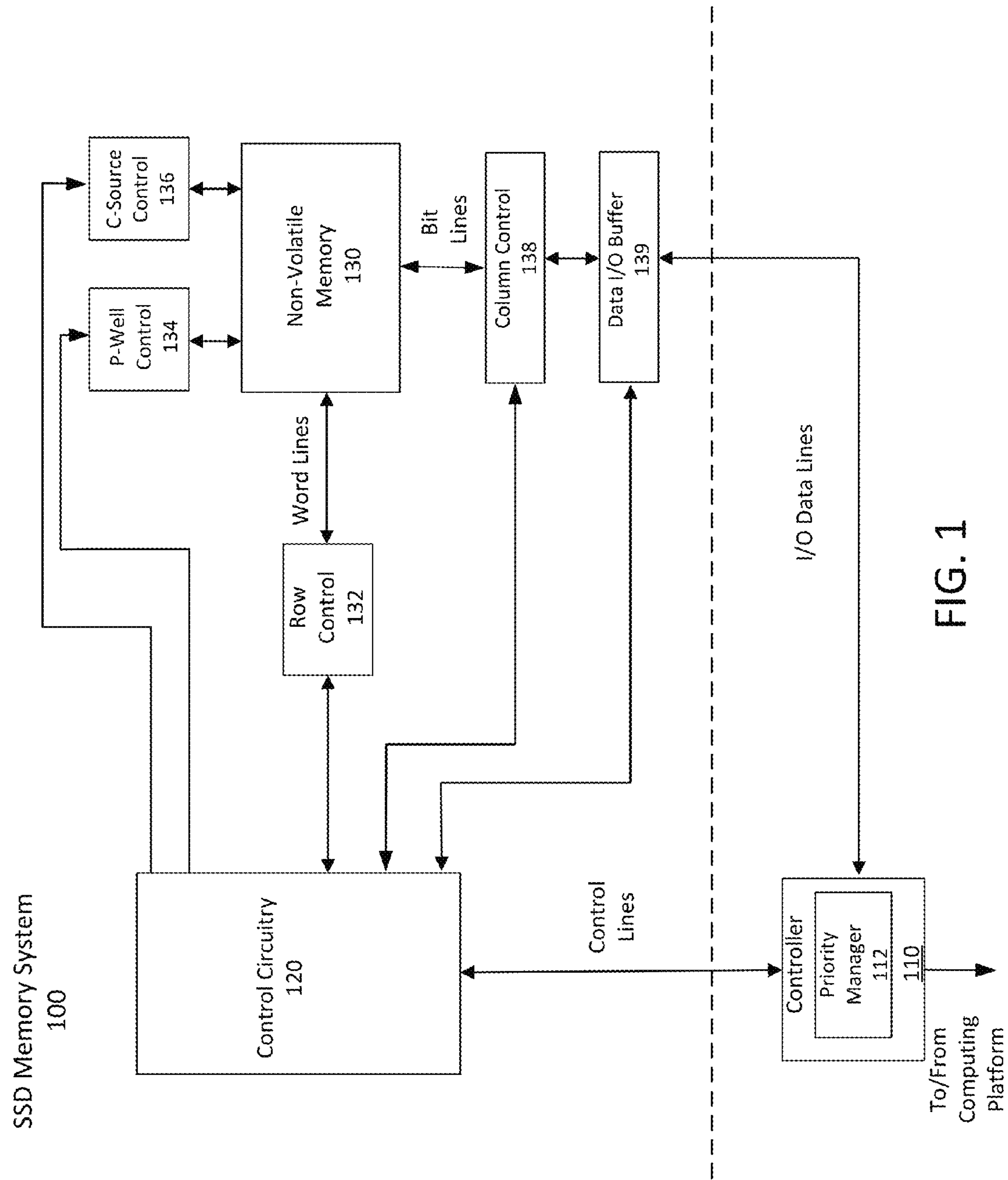
FIG. 1 illustrates an example memory system.

FIG. 1 illustrates a diagram of an example SSD SSD memory system 100. In some examples, as shown in FIG. 1, SSD memory system 100 may include a controller 110, control circuitry 120, a non-volatile memory 130. In some examples, various memory operations performed by non-volatile memory 130 may be controlled by row control 132, p-well control 134, c-source control 136 and column control 138. Overall operations of non-volatile memory 130 may be controlled or directed by control circuitry 120 and/or controller 110. A data input/output buffer 139 may be configured to at least temporarily store data written to or read from non-volatile memory 130. Also, as shown in FIG. 1, controller 110 includes a priority manager 112. As described more below, priority manager 112 includes logic and/or features that may generate or provide an MRR table that includes priority-based or count-ranked entries that may be dynamically or adaptively assigned. According to some examples, the priority-based or count-based entries may be adaptively assigned based on such criteria as program/erase cycle counts associated with memory cells of non-volatile memory 130, MRR tables used by other non-volatile memories, historical operating parameters for non-volatile memory 130, possible defects or operating characteristics associated with one or more memory cells of non-volatile memory 130 such as program disturb or intrinsic charge loss or success of given entries to recover from a read error.

In some examples, non-volatile memory 130 may be a non-volatile type of memory such as, but not limited to, NAND memory, phase change memory (PCM), PCM with an Ovonic threshold switch (PCMS), nanowire memory, or ferroelectric transistor random access memory (FeTRAM). For these examples, one or more memory cells included in non-volatile memory 130 may be configured to maintain a plurality of states or bits. The plurality of bits may be maintained or stored in the memory cells via implementation of either single-level cell (SLC) or multi-level cell (MLC) programming.

According to some examples, row control 132 may be coupled to word lines of non-volatile memory 130. For these examples, row control 132 may be coupled via the word lines to select one of the word lines, apply read voltages, apply program voltages combined with bit line potential levels controlled by column control 138, and apply erase voltages. Also, column control 138 may be coupled to bit lines of non-volatile memory 130 to read data stored in the memory cells, determine a state of the memory cells during a program operation, and control potential levels of the bit lines to promote or inhibit programming and erasing. P-well control may control the p-well voltage of non-volatile memory 130 and c-source control 136 may control a common source line coupled to non-volatile memory 130.

In some examples, column control 138 may be configured to read out data stored or maintained in non-volatile memory 130 and the data may be output to external I/O data lines via data I/O buffer 139. For these examples, program data to be stored in the memory cells of non-volatile memory 130 may be input to data I/O buffer 139 via the external I/O data lines and then transferred to column control 138. As shown in FIG. 1, in some examples, the external I/O data lines may be coupled to or managed by controller 110.

According to some examples, command data for controlling elements of SSD memory system 100 such as non-volatile memory 130 may be relayed from controller 110 or elements of controller 110 (e.g., priority manager 112) via control lines coupled to control circuitry 120. The control data, for examples, may inform the elements of SSD memory system 100 as to what operation is requested.

In some examples, controller 110 may be coupled with or configured to couple with a host system such as a computing platform or computing device. The computing platform may be implemented as part of a server, a desktop computer, a personal computer (PC), a laptop computer, an ultra-mobile computer, a tablet, a touch pad, a portable computer, a handheld computer, a palmtop computer, a personal digital assistant (PDA), a cellular telephone, a combination cellular telephone/PDA, television, a smart device (e.g., smart phone, smart tablet or smart television), a mobile internet device (MID), a messaging device, a data communication device, and so forth. For these examples, controller 110 may communicate with elements of the computing platform to read data from or write data to non-volatile memory 130. Controller 110 may be configured to receive commands from the computing platform and forward the commands to control circuitry 120. Controller 110 may also be configured to control I/O data lines between SSD memory system 100 and the computing platform.

According to some examples, SSD memory system 100 may be incorporated as an integrated system that includes controller 110 on a single circuit board or other type of integrated packaging. For these examples, the integrated system may include a plurality of non-volatile memory 130_s_ and associated control circuitry. The integrated system may be embedded as part of a computing platform or may be included in a type of configuration that may be removably coupled to a computing platform. This type of configuration may include all of the elements of SSD memory system 100 depicted in FIG. 1 or just the elements above the dotted-line shown in FIG. 1. Controller 110 may therefore be embedded with the computing platform or may be included in an SSD memory system that is removable from the computing platform.

In some examples, SSD memory system 100 may be configured to be coupled with a host device, including, but not limited to, various computing and/or consumer electronic devices/appliances, such as desktop, laptop, or tablet computers. To that end, the interface may comprise any suitable interface for coupling SSD memory system 100 to the host device, such as, for example, but not limited to, a serial advanced technology attachment (SATA) interface, a serial attached SCSI (SAS) interface, a universal serial bus (USB) interface, a peripheral control interface (PCI), or other suitable device interface.

Figure 2:
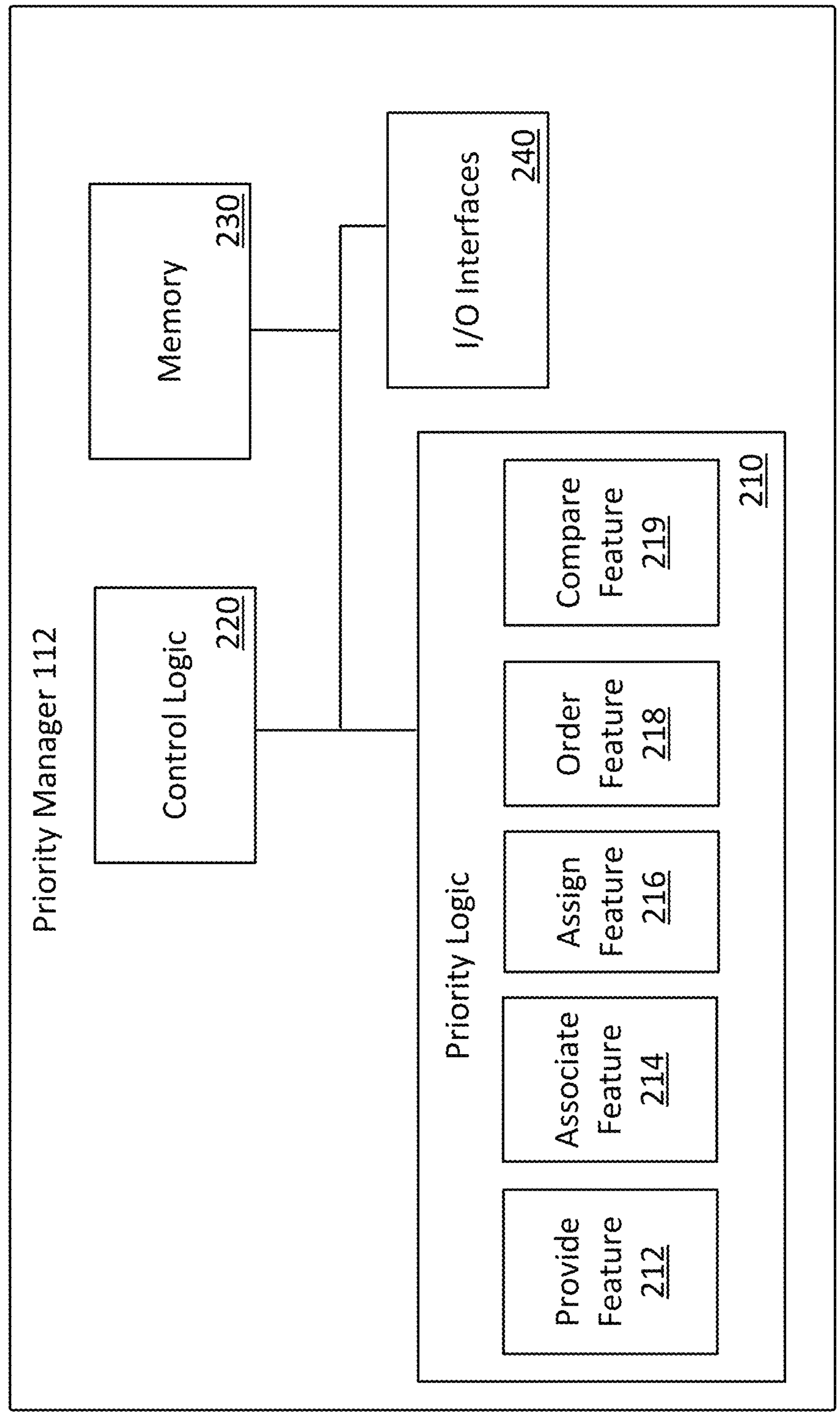
FIG. 2 illustrates a block diagram of an example architecture for a priority manager.

FIG. 2 illustrates a block diagram of an example architecture for priority manager 112. In some examples, priority manager 112 includes features and/or logic configured or arranged to generate or provide an MRR table that includes priority-based or count-based entries of the MRR table that may be adaptively ordered for use to recover from a reading error.

According to some examples, as shown in FIG. 2, priority manager 112 includes priority logic 210, control logic 220, a memory 230 and input/output (I/O) interfaces 240. As illustrated in FIG. 2, priority logic 210 may be coupled to control logic 220, memory 230 and I/O interfaces 240. Priority logic 210 may include one or more of a generate feature 212, an associate feature 214, an assign feature 216, a count feature 217, an order feature 218 or a compare feature 219, or any reasonable combination thereof.

In some examples, the elements portrayed in FIG. 2 are configured to support or enable priority manager 112 as described in this disclosure. A given priority manager 112 may include some, all or more elements than those depicted in FIG. 2. For example, priority logic 210 and control logic 220 may separately or collectively represent a wide variety of logic device(s) or executable content to implement the features of priority manager 112. Example logic devices may include one or more of a microprocessor, a microcontroller, a processor circuit, a field programmable gate array (FPGA), an application specific integrated circuit (ASIC), a sequestered thread or a core of a multi-core/multi-threaded microprocessor or a combination thereof.

In some examples, as shown in FIG. 2, priority logic 210 includes provide feature 212, associate feature 214, assign feature 216, count feature 217, order feature 218 or compare feature 219. Priority logic 210 may be configured to use one or more of these features to perform operations. For example, provide feature 212 may generate or provide an MRR table including a number of prioritized entries used to recover from a reading error of one or more memory cells of a non-volatile memory. Associate feature 214 may associate one or more of the prioritized entries with memory cell characteristics such as program disturb or intrinsic charge loss. Assign feature 216 may facilitate the assignment or reassignment of priorities for the MRR table entries. Count feature 217 may increment or decrement counts associated with MRR entries for ordering these MRR entries. Order feature 218 may order the prioritized/count-associated entries such that an entry having a highest assigned priority or count is used first when the MRR table is used to recover from a reading error of the one or more memory cells. Compare feature 219 may compare the MRR table to MRR tables for other non-volatile memories and/or to historical information associated with use of the MRR table to recover from reading errors. The embodiments are not limited in this respect.

In some examples, control logic 220 may be configured to control the overall operation of priority manager 112. As mentioned above, control logic 220 may represent any of a wide variety of logic device(s) or executable content. For some examples, control logic 220 may be configured to operate in conjunction with executable content or instructions to implement the control of priority manager 112. In some alternate examples, the features and functionality of control logic 220 may be implemented within priority logic 210.

According to some examples, memory 230 may be arranged to store executable content or instructions for use by control logic 220 and/or priority logic 210. The executable content or instructions may be used to implement or activate features or elements of priority manager 112. As described more below, memory 230 may also be arranged to at least temporarily maintain information associated with providing an MRR table. Memory 230 may also be arranged to at least temporarily maintain historical information associated with use of the MRR table to recover from read errors. Memory 230 may also be arranged to maintain counts associated with MRR table entries.

Memory 230 may include a wide variety of non-volatile memory media including, but not limited to, one or more types of flash memory, programmable variables or states, read-only memory (ROM), or other types of static storage media. In some examples, if implemented in a computing platform without power constraints (e.g., large battery or power cord), memory 230 may include a wider variety of memory media that may also include types of volatile memory, such as dynamic random access memory (DRAM) or other types of dynamic storage media.

In some examples, I/O interfaces 240 may provide an interface via a local communication medium or link between priority manager 112 and elements of SSD memory system 100 depicted in FIG. 1 or elements of a host or computing platform. I/O interfaces 240 may include interfaces that operate according to various communication protocols or standards to communicate over the local communication medium or link. These communication protocols or standards may be described in one or more industry standards (including progenies and variants) such as those associated with the Peripheral Component Interconnect (PCI) Express Base Specification ("PCI Express" or "PCIe"), the Non-Volatile Memory Express (NVMe) Specification, the Open NAND Flash Interface Specification (ONFi), the Inter-Integrated Circuit ($I^2C$) specification, the System Management Bus (SMBus) specification, the Accelerated Graphics Port (AGP) specification, the Peripheral Component Interconnect Express (PCI Express) specification, the Universal Serial Bus (USB), specification or the Serial Advanced Technology Attachment (SATA) specification. This disclosure is not limited to only the above-mentioned standards and associated protocols.

Figure 3:
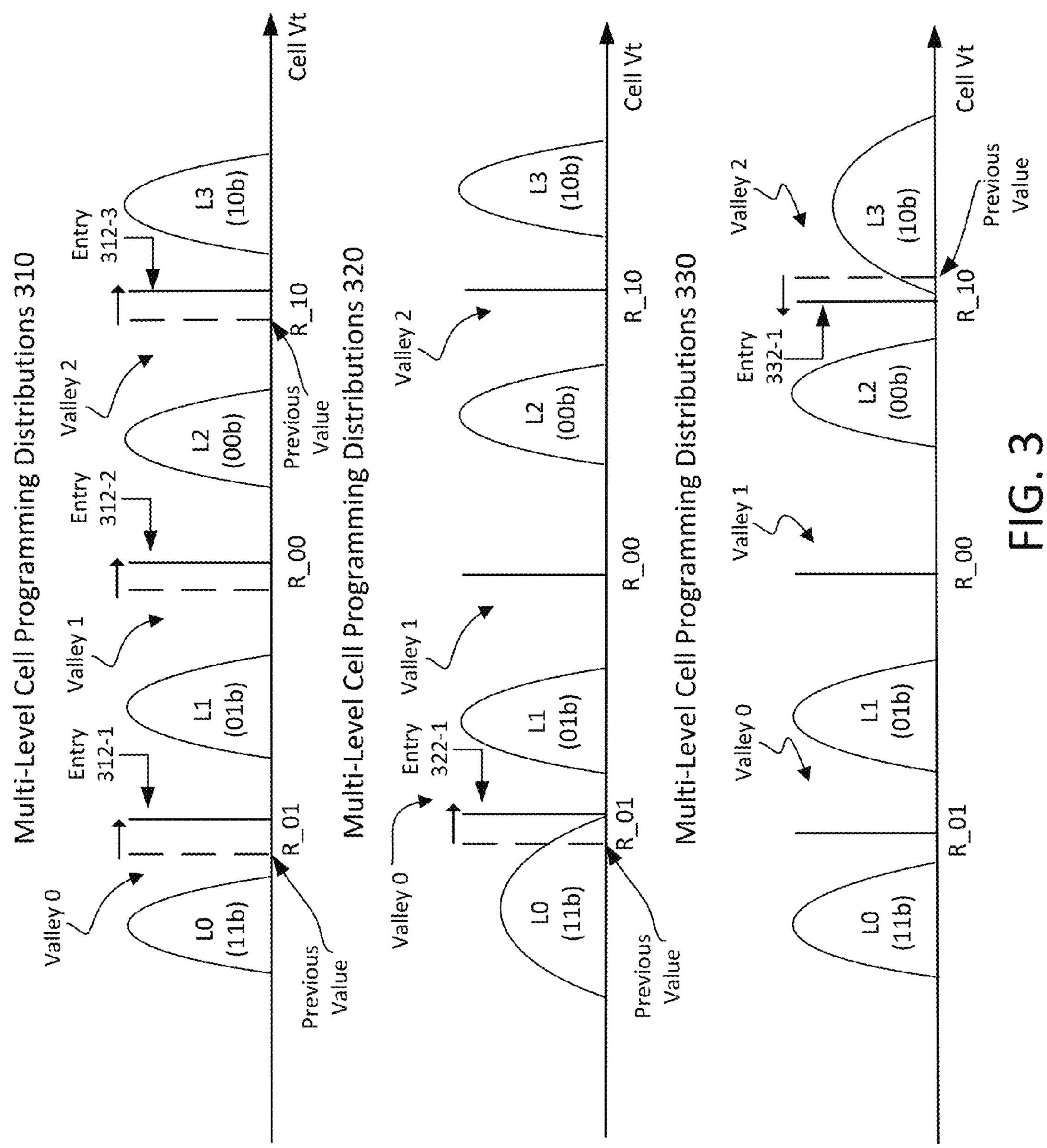
FIG. 3 illustrates example multi-level cell programming distributions.

FIG. 3 illustrates example multi-level cell programming distributions. As shown in FIG. 3, multi-cell programming distributions 310, 320 and 330 include levels L0 to L3 arranged to maintain binary values of "11", "01", "00" and "10", respectively. Also shown in FIG. 3 for the multi-level cell programming distributions are example read references R_01, R_00 and R_10 that may be used to read values according to the multi-level cell programming distributions. This disclosure is not limited to a multi-level programming distribution having four levels and maintaining the binary values as shown in FIG. 3 and any number of levels may be contemplated to maintain other combinations of binary values. In some examples, as shown in FIG. 3, cell threshold voltage (Vt) is shown as increasing from right to left along the horizontal axis.

In some examples, as shown in FIG. 3, valleys 0-3 included in multi-cell programming distributions 310, 320 or 330 indicate areas along the Vt axis that are between distributed levels L0 to L3. For example, valley 0 falls between L0 and L1, valley 1, between L1 and L2 and valley 3 between L2 and L3. Characteristics of memory cells included in a non-volatile memory, for example, may cause valley 0 between L0 and L1 to decrease or valley 2 between L3 and L2 to decrease.

According to some examples, program disturb may be a characteristic that causes the peak associated with L0 to widen as program/erase cycle count increase for memory cells. For example, multi-level cell programming distributions 310 shows a relatively tall and narrow peak for maintaining value "11" at L0. However, the smaller and wider peak for L0 causes valley 0 in multi-level cell programming distributions 320 to be much smaller than valley 0 in multi-level cell programming distribution 310.

In some examples, intrinsic charge loss may be a characteristic that may cause the peak associated with L3 to widen. These characteristics may include, but are not limited to, possible memory cell defects or a length of time a memory cell is powered on. As shown in FIG. 3, multi-level cell programming distributions 310 shows a relatively tall and narrow peak for maintaining value "10" at L3. However, the smaller and wider peak for L3 causes valley 2 in multi-level cell programming distributions 330 to be much smaller than valley 2 in multi-level cell programming distributions 310.

According to some examples, a read error may occur while attempting to read values maintained at L0 to L3 of multi-level cell programming distributions 310. For these examples, an MRR table including a plurality of entries may be used to recover from the read error. Each of the entries may indicate one or more MRR values. As described more below, priority manger 112 may include logic and/or features that may have been generated or updated the MRR table and then order the entries based on assigned priorities or counts. Entries 312-1, 312-2 and 312-3 as shown in FIG. 3 may represent three separate MRR values from an entry of the MRR table that may have been assigned the highest priority or count and thus used first to recover from the read error. In some examples, the memory cells associated with multi-cell programming distributions 310 may be relatively new and have low program/erase cycle counts. As a result of being new, entries 312-1, 312-2 and 312-3 may be associated with factory default MRR values and thus may be assigned the highest priority for use to recover from the read error.

In some examples, a read error may occur while attempting to read values maintained at L0 to L3 of multi-level cell programming distributions 320. For these examples, the reading error may be associated with values maintained at L0 or L1. As shown in FIG. 3, entry 322 may be an entry from an MRR table. Entry 322 may have a single MRR value that may be used to recover from the reading error. Priority manager 112 may be assigned entry 322 with the highest priority based on information indicating that a memory cell associated with multi-level cell programming distribution 320 may have a program disturb characteristic that causes the peak at L0 to shorten and widen. Thus a shift of R_01 to the right as shown in FIG. 3 may allow for recovery from the read error.

According to some examples, a read error may occur while attempting to read values maintained at L0 to L3 of multi-level cell programming distributions 330. For these examples, the reading error may be associated with values maintained at L2 or L3. As shown in FIG. 3, entry 332 may be an entry from an MRR table. Entry 332 may have a single MRR value that may be used to recover from the reading error. Priority manager 112 may have assigned entry 332 with the highest priority based on information indicating that a memory cell associated with multi-level cell programming distribution 320 may have intrinsic charge loss characteristics that causes the peak at L2 to shorten and widen. Thus a shift of R_10 to the left as shown in FIG. 3 may allow for recovery from the read error.

FIG. 4 illustrates example program disturbs (PDs) for a portion of multi-level cell programming distributions. As shown in FIG. 4, PDs 410, 420 and 430 depict various shapes of L0 holding the value of "11". In some examples, PDs 410, 420 and 430 may represent memory cell characteristics associated with various program/erase cycle counts. For these examples, PD 410 may be a program disturb associated with a first count of program/erase cycle counts for the memory cell. PD 420 may be a program disturb associated with a second count of program/erase cycle counts and PD 430 may be a program disturb associated with a third count of program/erase cycle counts. Also, for these examples, the first count may include the lowest number of program/erase cycles and the third count may include the highest number of program/erase cycles.

According to some examples, priority manager 112 may include logic and/or features arranged to generate or provide an MRR table that includes entries that may be used to recover from reading errors associated with reading values from L0 or L1 based on which program disturb is expected or anticipated. For these examples, the entries may include entries 412, 422 and 432. As shown in FIG. 4, each of these entries may include an MRR value that moves R_01 further to the right in order to adjust for the changing shape of the peak associated with L0.

Figure 5:
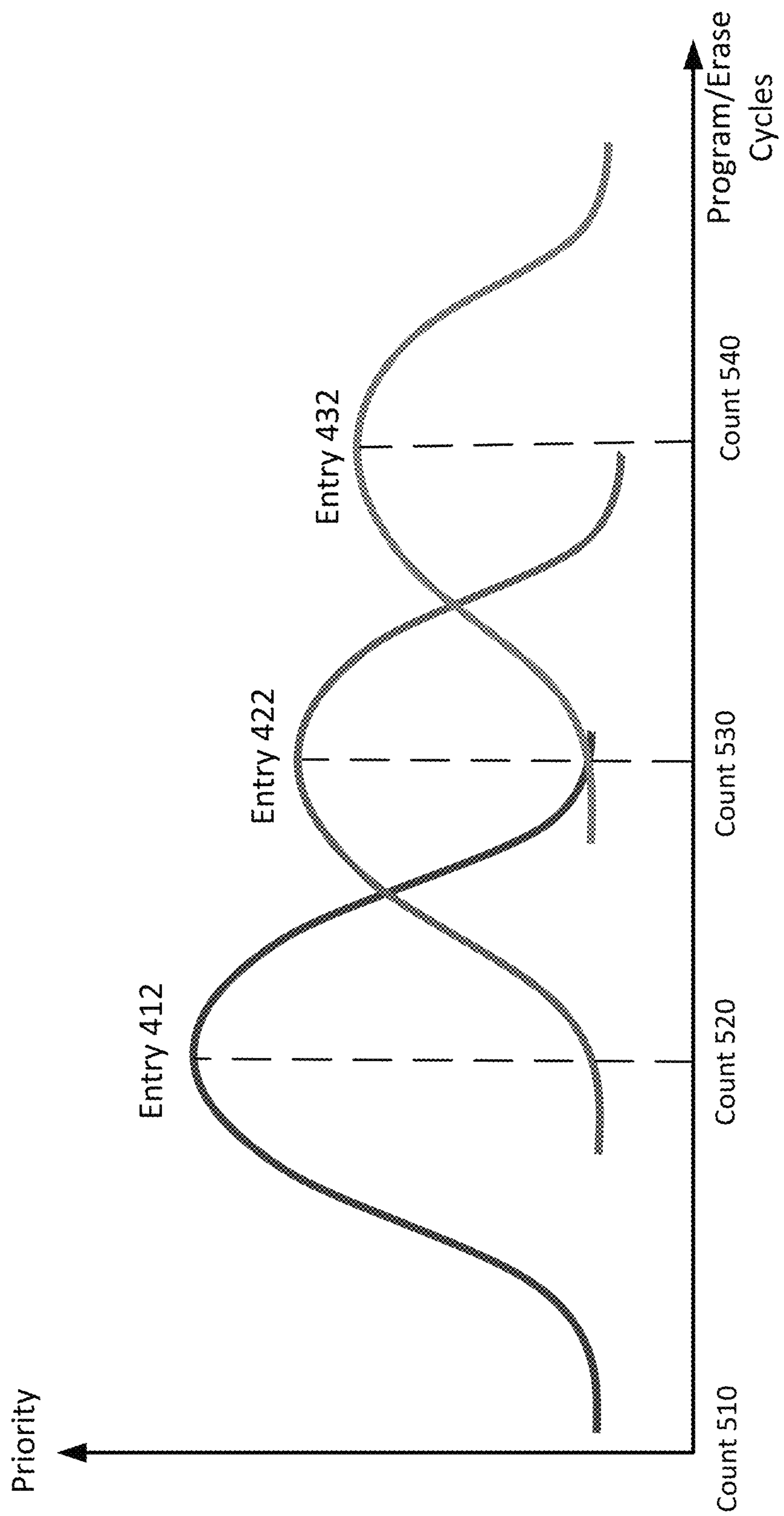
FIG. 5 illustrates an example diagram.

FIG. 5 illustrates an example diagram 500. In some examples, as shown in FIG. 5, a series of bell curves depict how program manager 112 may assign priorities to entries 412, 422 and 432. For these examples, a priority (y-axis) to be assigned to a given entry changes for each of the entries based on program/erase cycles (x-axis) that increase as diagram 500 moves to the right. In some examples, count 510 may represent a program/erase cycle count of 0 and counts 520, 530 and 540 may represent successively higher program/erase cycle counts. For example, count 520 may represent 1,000 program/erase cycle counts, count 530 may represent 10,000 program/erase cycle counts and count 540 may represent 30,000 program/erase cycle counts.

In some examples, as shown in FIG. 5, following count 510, the curve associated with entry 412 rises in priority and peaks at count 520. Meanwhile, following the peak priority of entry 412 at count 520, the curve associated entry 422 begins to rise in priority and peaks at count 530. Then following entry 422's peak at count 530, the curve associated with entry 432 rises and peaks at count 540.

According to some examples, the peak priority assigned to entries 412, 422, 432, respectively, may be successively lower as shown in FIG. 5. This lowering of the priority may be attributed to MRR values tailored to address cycling dependent non-volatile memory error mechanisms such as program disturb having less success in recovering from read errors as the program/erase cycle counts reach relatively high numbers for memory cells. For these examples, other MRR values for other entries may become more relevant and effective to recover from read errors after a memory cell has been subject to a high program/erase cycle count. As a result of being more relevant and effective, these other entries may be assigned higher priorities compared to at least entry 432.

Although cycling dependent non-volatile memory error mechanisms such as program disturb are described for FIG. 5, other error mechanisms may be cycling dependent. For example, intrinsic charge loss error mechanisms may also be cycling dependent. For these types of error mechanisms, similar bell curves may be assigned to MRR table entries associated with recovering from intrinsic charge loss.

FIG. 6 illustrates example count-based MRR tables. As shown in FIG. 6, MRR tables 610, 620, 630 and 640 may be based on counts 510, 520, 530 and 540, respectively, as mentioned above for FIG. 5. As shown in FIG. 6, eight separate entries may be included in MRR tables 610, 620, 630 and 640. In some examples, each of the eight separate entries may include one or more MRR values for reading reference values R_01, R_00 or R_10 in millivolts (mv). Positive values indicate a shift to the right on a cell Vt axis for multi-level cell programming distributions such as those shown in FIG. 3 and negative values indicate a shift to the left. This disclosure is not limited to MRR tables having eight entries or to the included moving read reference values for each entry as shown in FIG. 6.

According to some examples, as shown in FIG. 6, the entries associated with MRR tables 610, 620, 630 and 640 may include factory default, partial block program, PD 410, PD 420, PD430, intrinsic charge loss (ICL) 1, ICL 2 and ICL 3. For these examples, priority manager 112 may include logic and/or features arranged to generate or provide MRR tables 610, 620, 630 and 640 at counts 510, 520, 530 and 540, respectively. These MRR tables may have entries to indicate one or more MRR values for reading reference values R-01, R_00 or R_10. For example, the factory default entry may include MRR values established to initially recover from reading errors at count 510. The partial block program entry may include MRR values to recover from read errors associated with a partial block programmed page. PDs 410, 420 and 430 may include MRR values to recover from program disturbs as described above for FIG. 4 and mentioned in FIG. 3. ICLs 1, 2 and 3 may include MRR values to recover from intrinsic charge loss characteristics as mentioned above for FIG. 3.

In some examples, priority manager 112 may generate or provide MRR table 610 at count 510. For this example, the factory default entry may be assigned the highest priority when an MRR table is first provided. As mentioned for FIG. 5, count 510 may be associated with the lowest program/erase cycle count. Thus, as shown in FIG. 6, the factory default entry may be assigned the highest priority value of 1.0 by priority manager 112 when providing MRR table 610. Also, for these examples the partial block program entry may be assigned the second highest priority of 0.9. Also, as shown in FIG. 6 for MRR table 610, each prioritized entry may have an order number. According to some examples, the order number indicates the sequence via which an entry is used when MRR table 610 is used to recover from a read error. So the factory default entry having an order number of 1 in MRR table 610 would be the first entry used and then the partial block program entry having an order number of 2 would be the second entry used.

According to some examples, PD 410, PD 420 and PD 430 may each include an R_01 MRR value that may relate to entries 412, 422 and 432, respectively, as mentioned above for FIGS. 4 and 5. For these examples, the assigned priorities for PD 410, PD 420 or PD 430 may change according to program/erase cycle counts as shown in FIG. 5. For example, priority manager 112 may provide MRR table 620 at count 520 that assigns PD 410 the highest priority and hence ordered as the first entry to be used to recovery from a read error. Priority manager 112 may also provide MRR table 630 at count 530 that assigns PD 420 as having the highest priority and then may provide MRR table 640 that assigns PD 430 the highest priority. The other entries for each of these tables are then ordered according to their reassigned priorities as indicated in FIG. 6.

In some examples, in addition to assigning priorities based on program/erase cycle counts, priority manager 112 may include logic and/or features to assign higher priorities based on an amount of time the non-volatile memory may be powered on or receiving power. For these examples, longer power on times may indicate exposure to elevated operating temperatures for the non-volatile memory. Elevated operating temperatures may increase the likelihood of intrinsic charge loss for one or more memory cells of the non-volatile memory. Priority manager 112 may compare this powered on time to a given threshold time value (e.g., 14 days) and then assign a higher or highest priority to one of ICL 1, 2 or 3 if the threshold time value has been exceeded.

FIG. 7 illustrates an example comparison MRR table for providing an MRR table. According to some examples, an MRR table such as MRR table 720 may be provided for a non-volatile memory based on comparisons to MRR table entries used by another non-volatile memory. As shown in FIG. 7, MRR comparison table 710 may include historical information to indicate a success rate for using given entries to recover from a read error at memory cells of the other non-volatile memory. For example, table 710 indicates a success rate of 85% for the entry associated with ICL 1. The other intrinsic charge loss entries of ICL 2 and 3 indicate success rates of 75% and 65%, respectively. For these examples, non-volatile memory 130 and the other non-volatile memory may be included in a storage device and may be the same type of memory (e.g., NAND) that may have been manufactured together using the same process. As a result of being the same type and manufactured together, both non-volatile memories may have a higher likelihood of sharing similar memory cell characteristics. Also, internal mechanisms (e.g., maintained in firmware) may distribute program/erase cycle counts evenly across the non-volatile memories. Hence due to similar types, manufacturing process or program/erase cycle counts memory cell characteristics such as intrinsic cell loss or program disturbs may be similar for the two non-volatile memories. So priority manager 112 may provide MRR table 720 such that the priorities for the entries included in this table match the priorities of MRR comparison table 710 and thus may assign ICL 1 the highest priority as shown in FIG. 7.

According to some examples, priority manager 112 may include logic and/or features to gather information associated with each of the entries included in table 720 to determine success rates similar to those shown for MRR comparison table 710. Priority manager 112 may compare the two success rates to makes sure they are similar. If the success rates appear to diverge (e.g., greater than a 20% difference), priority manger 112 may stop providing MRR table 720 based on a comparison to MRR comparison table 710. Priority manager 112 may also stop providing MRR table 720 based on the comparison if non-volatile memory 130 begins to suffer from a substantially higher number of read failures than does the other non-volatile memory. Both of these examples may be indications that the two non-volatile memories are not performing similar and may not have similar defects or characteristics and should not use similar MRR tables.

In some examples, in addition to or alternatively to success percentage, the other non-volatile memory as well as non-volatile memory 130 may be arranged to maintain a successful MRR table entry log. The successful MRR table entry log may track a number of successes of a given entry to recover from a read error. According to some examples, each entry may have a limited number of success entries to ensure that any one particular successful entry doesn't fill up the entire log and make it difficult to determine what entries were the second, third, fourth, etc. most successful entries.

FIG. 8 illustrates an example MRR table 800 updated based on bit-flip information. According to some examples, an MRR table such as MRR table 800 may be provided for a non-volatile memory based on bit-flip information gathered by priority manger 112. Bit-flip information may be related to "0" to "1" bit-flips or "1" to "0" bit-flips associated with MRR values for read reference value R__01 and for read reference value R__10 for a multi-level cell program distribution such as the one shown in FIG. 3. For these examples, priority manager 112, may take note of values maintained at levels L1 or L2 and monitor whether MRR value for read reference value R__01 or read reference value R__10 caused a bit-flip.

In some examples, a bit-flip for moving the read reference value R__10 may indicate intrinsic charge loss as an error mechanism or characteristic of the memory cells of the non-volatile memory. For example, as shown for multi-level cell programming distribution 330 in FIG. 3, the cell Vt distance shrinks between L2 and read reference value R__10 when moving the read reference value of R__10 to the left. The shrinking size of the cell Vt distance, for example, may lead to a number of "0" to "1" bit-flips for the value maintained at L2.

According to some examples, priority manager 112 may include logic and/or features to provide MRR table 800 based on gathered bit-flip information. For these examples, priority manager 112 may associate ICL 1 with an MRR value of −100 mv for read reference value R__10 based on anticipation that using this MRR value of −100 mv may lead to bit-flips for the bit maintained at L2. In some examples, priority manager 112 may then assign the highest priority to the ICL 1 entry as shown in FIG. 8. The other ICL entries may also have high priorities. Meanwhile the program disturb entries may have lower priorities because reading errors caused by a program disturb may be less likely and thus MRR values included in these entries may not result in a recovery from a read error.

In some alternative examples, if reading reference value R__01 had been found to cause more bit-flips compared to reading reference value R__10, then an error mechanism may be a program disturb rather than intrinsic charge loss. For these alternative examples, priority manager 112 may associate the entry of PD 410 that has an MRR value of +100 mv for read reference value R__01 with the bit-flips and then assign the highest priority to PD 410. High priorities may also be assigned to PD 420 and PD 430. Also, low priorities may then be assigned to ICL 1, ICL 2 and ICL 3.

Figure 9:
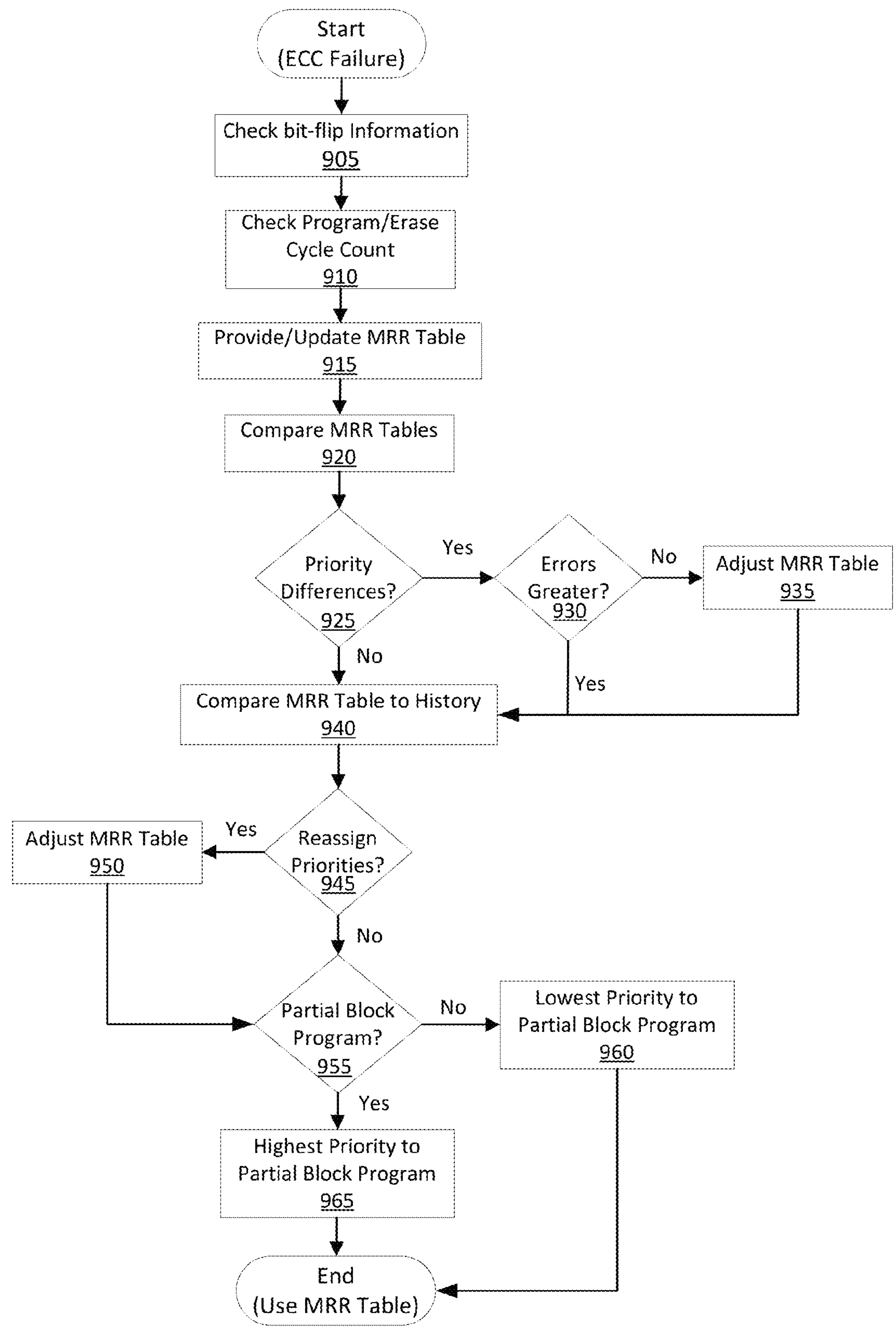
FIG. 9 illustrates a flow chart of example operations for providing an MRR table.

FIG. 9 illustrates a flow chart of example operations for providing an MRR table. In some examples, elements of SSD memory system 100 as shown in FIG. 1 may be used to illustrate example operations related to the flow chart depicted in FIG. 9. Priority manager 112 as shown in FIG. 1 and FIG. 2 may also be used to illustrate the example operations. Multi-level cell programming distributions shown in FIGS. 3 and 4 or the MRR tables shown in FIGS. 6-8 may also be used to illustrate the example operations. But the described example operations are not limited to the elements described in FIGS. 1-8 such as SSD memory system 100, priority manager 112, the multi-level cell distributions or the example MRR tables.

In some examples, responsive to an ECC failure to recover from a read error for non-volatile memory 130, the process moves from the start to block 905. At block 905 (Check bit-flip Information), priority manager 112 may include logic and/or features configured to check bit-flip information (e.g., via associate feature 214). In some examples, the bit-flip information may be similar to the information gathered as mentioned above for FIG. 8. The gathered bit-flip information may determine whether non-volatile memory 130 may have either intrinsic charge loss or program disturb characteristics. For these examples, priority manager 112 may associate entries (e.g., PD 410) with bit-flip information that may indicate program disturb or may associate entries (e.g., ICL 1) with bit-flip information that may indicate intrinsic charge loss.

Proceeding from block 905 to block 910 (Check Program/Erase Cycle Count), priority manager 112 may include logic and/or features configured to check the program/erase cycle count for non-volatile memory 130 (e.g., via associate feature 214). As mentioned previously, such information as program/erase cycle counts may impact an assigned priority for MRR table entries such as those associated with MRR values used to address program disturb related errors and/or possibly address intrinsic charge related errors.

Proceeding from block 910 to block 915 (Provide/Update MRR Table), priority manager 112 may include logic and/or features configured to use the bit-flip and program/erase count information to provide or update an MRR table (e.g., via provide feature 212). In some examples, the MRR table may be similar to MRR tables 610-640, 720 or 820 and may include eight entries. Priority manager 112 may also include logic and/or features to assign and/or update priority values to the eight entries (e.g., via assignment feature 216) based on the information gathered and the associations as mentioned above for blocks 905 and 910. Priority manager 112 may also include logic and/or features to order the entries based on the assigned and/or updated priorities (e.g., via order feature 218).

Proceeding from block 915 to block 920 (Compare MRR Tables), priority manager 112 may include logic and/or features configured to compare the provided MRR table for non-volatile memory 130 to an MRR table for another non-volatile memory (e.g., via compare feature 219). In some examples, the other non-volatile memory may be included in a same storage device as non-volatile memory 130 (e.g., part of an SSD).

Proceeding from block 920 to decision block 925 (Priority Differences?), priority manager 112 may include logic and/or features configured to determine if the MRR tables have different assigned priorities (e.g., via compare feature 219). In some examples, if the priorities are different the process moves to block 930. Otherwise, the process moves to block 935.

Moving from decision block 925 to decision block 930 (Errors Greater?), priority manager 112 may include logic and/or features configured to determine whether non-volatile memory 130 is subject to more read errors that the other non-volatile memory (e.g., via compare feature 219). In some examples, if non-volatile memory 130 is subject to more read errors, the MRR table for the other non-volatile memory may not be used to adjust the MRR table for non-volatile memory 130 and the process moves to block 940. Otherwise, the process moves to block 935.

Moving from decision block 930 to block 935 (Adjust MRR Table), priority manager 112 may include logic and/or features configured to adjust the provided MRR table to match the MRR priorities for the other non-volatile memory (e.g., via order feature 218).

Moving from decision block 925 or block 935 to block 940 (Compare MRR Table to History), priority manager 112 may include logic and/or features configured to gather information associated with the entries included in the provided MRR table for non-volatile memory 130 (e.g., via associate feature 214).

Proceeding from block 940 to decision block 945 (Reassign Priorities?), priority manager 112 may include logic and/or features configured to utilize the gathered information to determine whether priorities need to be reassigned for the entries in the provided and/or updated MRR table (e.g., via assign feature 216). In some examples, the information gathered may indicate that an entry having a high priority has failed to enable a recovery from a read error for one or more memory cells of non-volatile memory 130. For this example, the priority for this entry may be reassigned and the process moves to block 945. Otherwise, the process moves to decision block 955.

Moving from decision block 945 to block 950 (Adjust MRR Table), priority manager 112 may include logic and/or features configured to reassign priorities associated with one or more entries based on historical information that may indicate that these entries failed to enable a recovery form a read error (e.g., via assign feature 216). Priority manager 112 may then adjust the provided and/or updated MRR table by reordering (e.g., via order feature 218) the entries based on the newly assigned priorities such that the highest assigned priority is ordered to be used first.

Moving from decision block 945 or block 950 to decision block 955 (Partial Block Program?), priority manager 112 may include logic and/or features configured to determine if the ECC and/or read failure was associated with a partial block program page. In some examples, the provided and/or updated MRR table may be adjusted again such that entries associated with partial block program move read reference values are either assigned the lowest or highest priority in the provided MRR table. If priority manager 112 determines an association with the partial block program page, the process moves to block 965. Otherwise, the process moves to block 960.

Moving from decision block 955 to block 960 (Lowest Priority to Partial Block Program), priority manager 112 may include logic and/or features configured to assign the lowest priority to the entry associated with partial block program (e.g., via assign feature 216). If needed, the provided and/or updated MRR table may then be reordered (e.g., via order feature 218) to reflect this assigned priority.

Moving from decision block 955 to block 965 (Highest Priority to Partial Block Program), priority manager 112 may include logic and/or features configured to assign the highest priority to the entry associated with partial block program (e.g., via assign feature 216). If needed, the generated and/or updated MRR table may then be reordered (e.g., via order feature 218) to reflect this assigned priority.

Moving from either block 960 or block 965 the process comes to an end and the provided and/or updated MRR table may then be ready for use to recover from a read error of the one or more memory cells of non-volatile memory 130.

Figure 10A:
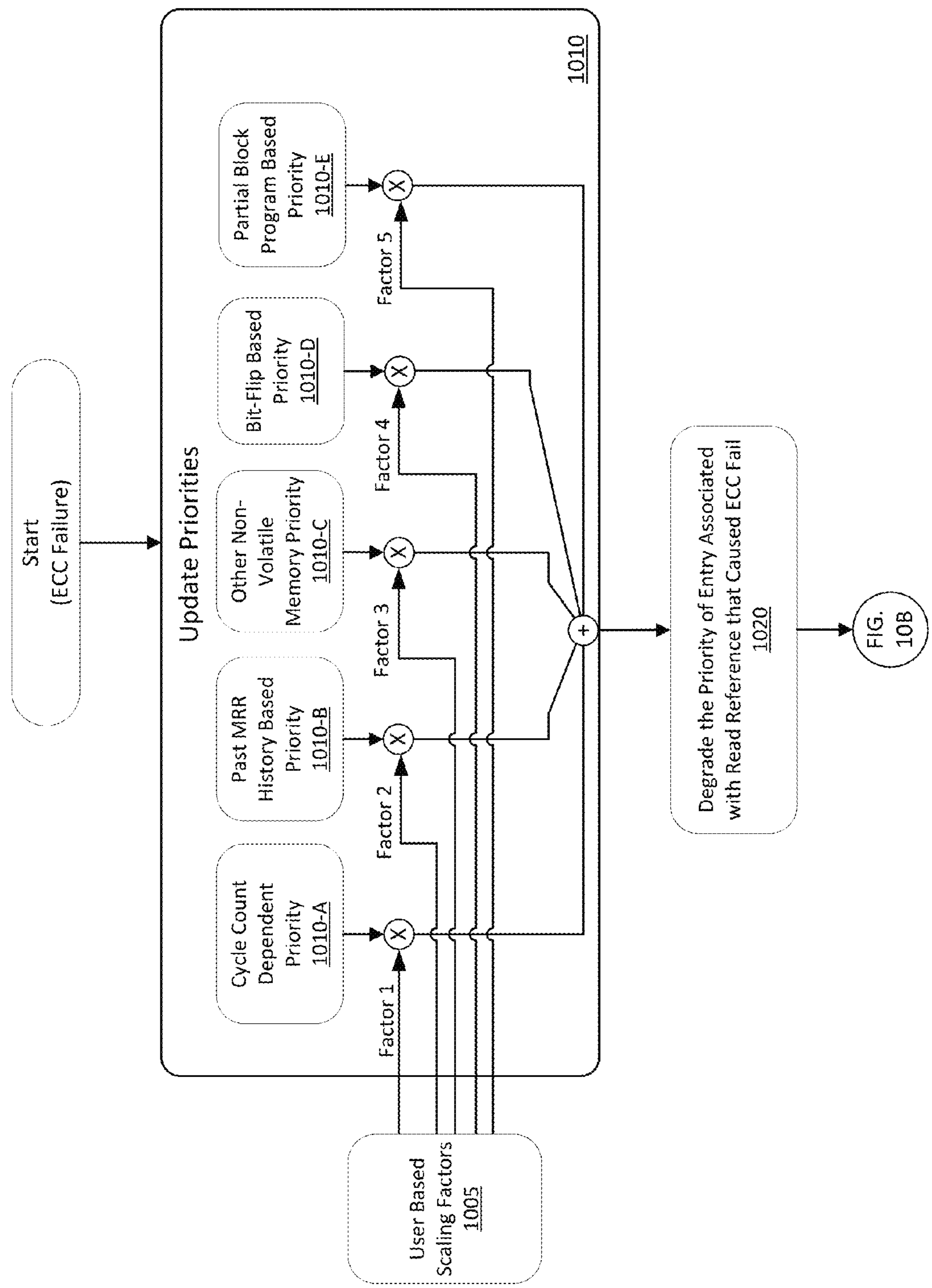
FIGS. 10A-B illustrate a flow chart of example operations for updating priorities and using an MRR table.
Figure 10B:
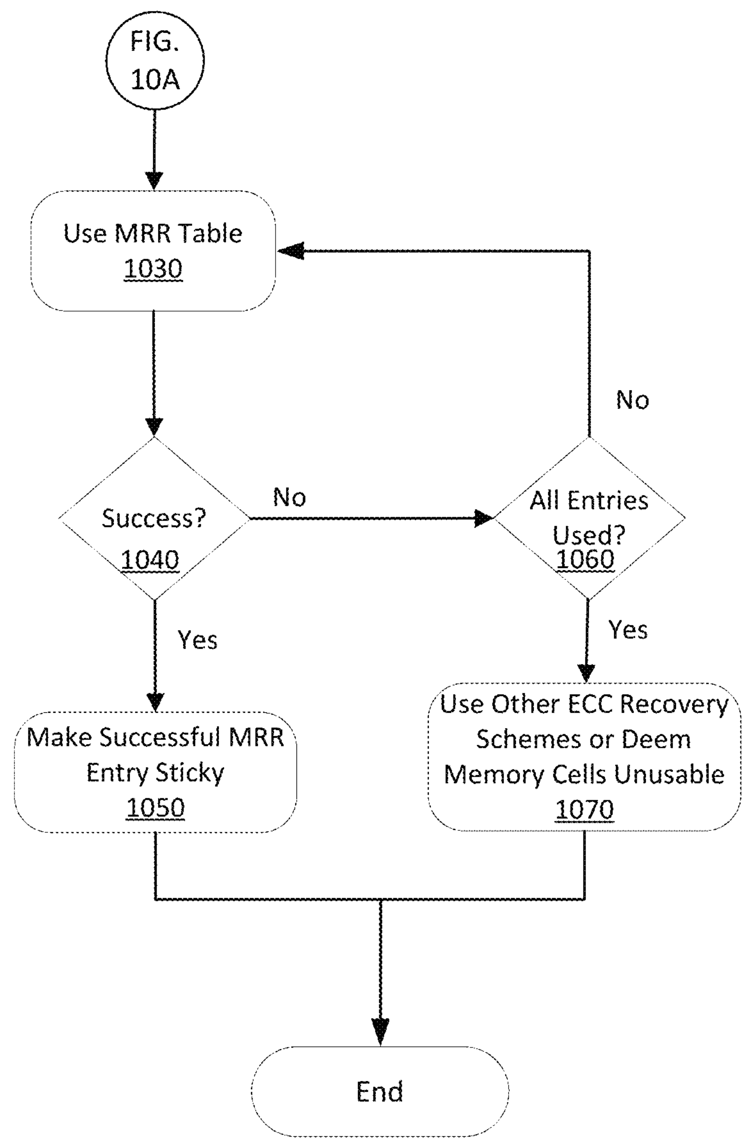

FIGS. 10A-B illustrate a flow chart of example operations for updating priorities and using an MRR table. In some examples, elements of SSD memory system 100 as shown in FIG. 1 may be used to illustrate example operations related to the flow chart depicted in FIGS. 10A-B. Priority manager 112 as shown in FIG. 1 and FIG. 2 may also be used to illustrate the example operations. Multi-level cell programming distributions shown in FIGS. 3 and 4 or the MRR tables shown in FIGS. 6-8 may also be used to illustrate the example operations. But the described example operations are not limited to the elements described in FIGS. 1-8 such as SSD memory system 100, priority manager 112, the multi-level cell distributions or the example MRR tables.

In some examples, as shown in FIG. 10A, responsive to an ECC failure to recover from a read error of one or more memory cells of non-volatile memory 130, the process moves from the start to block 1010. At block 1010 (Update Priority), priority manager 112 may include logic and/or features configured to update priorities for entries of an MRR table (e.g., via assign feature 216). In some examples, as shown in FIG. 10A, factors 1-5 at user based scaling factors 1005 (e.g., maintained in memory 230) may influence updated priority values derived based on priority schemes 1010-A to 1010-E. For these examples, as shown in FIG. 10A, the priority schemes may include a cycle count dependent priority 1010-A (e.g., PD 410, 420 or 430), a past MRR history based priority 1010-B (e.g., success rates), another non-volatile memory priority 1010-C (e.g., other non-volatile memories on same NAND device), a bit-flip based priority 1010-D, or a partial block program based priority 1010-E. Factors 1-5 may weight derived priorities from at least some of these five priority schemes to arrive at updated priorities for the entries of the MRR table. For example, a user may determine that program/erase cycle counts are the most import element in prioritizing MRR table entries and factor 1 may scale the results of cycle count dependent priority 1010-A accordingly. Also, the user may determine that bit-flips are the least important element and factor 4 may scale the results of bit-flip based priority 1010-D accordingly.

Proceeding from block 1010 to block 1020 (Degrade the Priority of Entry Associated with Read Reference that Caused ECC Fail), priority manager 112 may include logic and/or features configured to degrade an updated priority (e.g., via order feature 218). In some examples, even though priorities were updated according to the five priority schemes and the associated scaling factors, the MRR value may be substantially similar to a read reference value that caused or was associated with the ECC failure. This MRR value may have an elevated priority (e.g., higher than the lowest priority). For this example, program/erase cycle counts may be high enough that program disturb error mechanisms may be causing or leading to ECC failures for read reference values substantially similar to a read reference value after one or more MRR entries associated with program disturb (e.g., PDs 410, 420 or 430) are used. As a result of being substantially similar, even if program disturb related entries are assigned elevated updated priorities, at least some of these entries may be degraded or downgraded to a lower or lowest priority.

Proceeding from block 1020 as shown in FIG. 10A to block 1030 as shown in FIG. 10B (Use MRR Table), controller 110 for SSD memory system 100 may be arranged to use the MRR table having updated priorities for entries. In some examples, the entries included in the MRR table may be ordered according to their respective priorities such that entries having the highest priority are used first to recover from the read error that led to the ECC failure.

Proceeding from block 1030 to decision block 1040 (Success?), controller 110 may be arranged to determine whether an entry was successful in recovering from the ECC failure. If the entry was successful the process moves to block 1050. Otherwise the process moves to 1060.

Moving from decision block 1040 to block 1050 (Make Successful MRR Entry Sticky), priority manager 112 may include logic and/or features to ensure that a successful MRR entry is elevated in priority (e.g., via assign feature 216 or order feature 218). In some examples, elevating the priority of the successful MRR entry may result in that successful entry being used first or nearly first when the MRR table is used again to recover from a reading error of one or more memory cells of non-volatile memory 130.

Moving from decision block 1040 to decision block 1050 (All Entries Used?), controller 110 may be arranged to determine whether all of the entries included in the MRR tables have been used. If all of the entries of the MRR table have been used, the process moves to block 1070. Otherwise, the process returns to block 1030 and the next MRR table entry is used based on its sequence in the order.

Moving from decision block 1060 to block 1070 (Use Other ECC Recovery Schemes or Deem Memory Cells Unusable), controller 110 may be arranged to determine that moving read reference values have failed for all entries in the MRR table. In some examples, controller 110 may be arranged to either implement other ECC recovery schemes or may deem the one or memory cells of non-volatile memory as unusable or unreadable.

Moving from either block 1050 or 1070 the process comes to an end.

Figure 11:
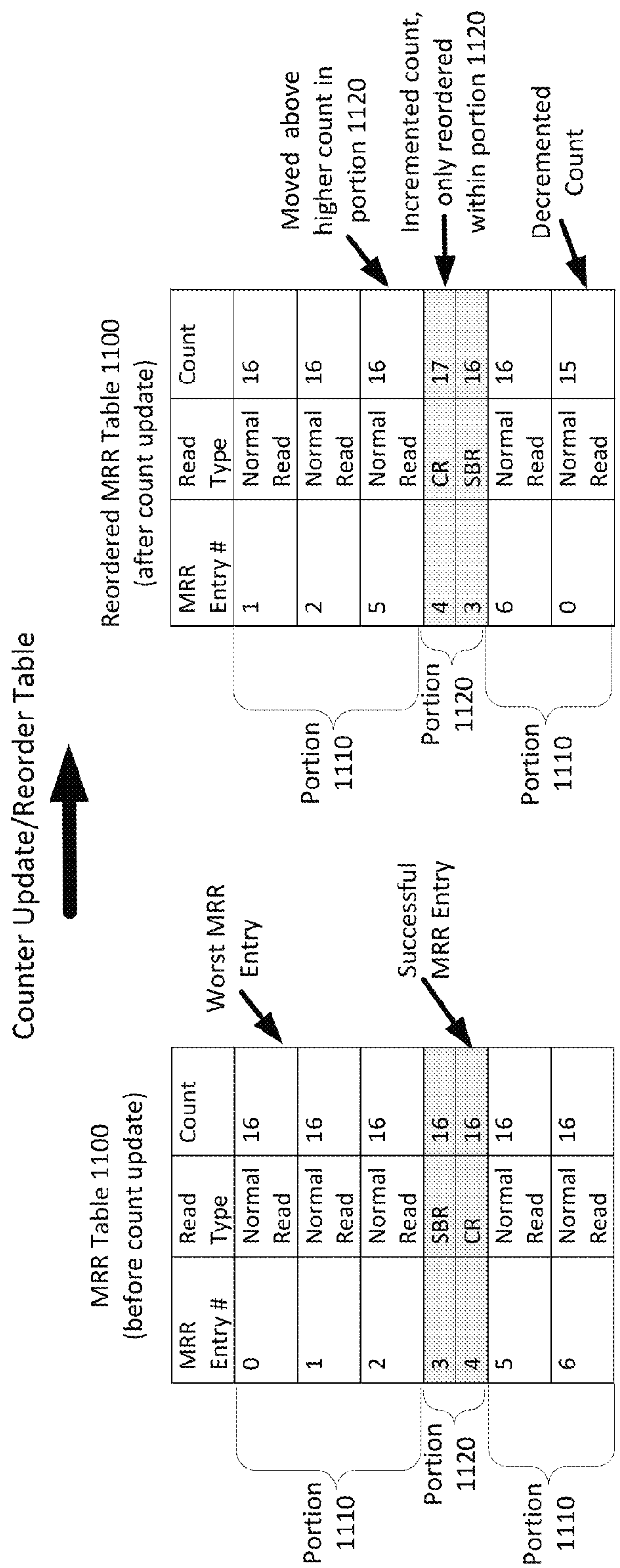
FIG. 11 illustrates an example MRR table being reordered after a count update.

FIG. 11 illustrates an example MRR table 1100 being reordered after a count update. According to some examples, as shown in FIG. 11, MRR table 1100 includes a portion 1110 and a portion 1120. For these examples, portion 1110 includes normal read types that have a single MRR value for each read reference value (e.g., R__01, R-00 or R__10). The single MRR value may be used to recover from a read error for one or more memory cells of a non-volatile memory included in a storage device. Also, portion 1120 includes other read types that are shown in the shaded part of MRR table 1100 as soft-bit-read (SBR) for entry 3 and corrective read (CR) for entry 4. SBR, CR or a combination of SBR and CR may include multiple MRR values for each read reference value. The multiple MRR values may be used to recover from a read error. Examples are not limited to SBR, CR or a combination of SBR and CR for MRR table entries having multiple MRR values, other read types having multiple MRR entries are contemplated.

In some examples, normal read types included in portion 1110 may have relatively small latencies associated with recovering from a read error (if successful) compared to read types such as SBR or CR that involve use of multiple MRR values. Multiple MRR values for each read reference value may result in better correction capabilities, but use of these multiple MRR values leads to more overhead and longer latencies compared to single MRR values. Further, adaptive MRR table techniques that may order MRR entries based on better correction capabilities may reorder entries having read types such as SBR or CR such that these entries may be the first to be used to recover from subsequent reading errors. This reordering may be problematic in situations where SBR or CR read types are disabled (e.g., not made as a sticky read reference value) following recovery from the read error. As a result of SBR or CR being disabled, MRR table re-tries may spike as a read reference value that may have led to previous read errors may still be actively used. For these situations, the MRR table with SBR or CR at the top may be used again to recover from subsequent read errors and the cycle continues.

According to some examples, MRR entries of MRR table may be ordered such that at least one entry of portion 1110 will be used to recover from a read error before entries of portion 1120 are used. As shown in FIG. 11, entries 0-2 included in portion 1110 may be ordered before the entries 3 and 4 in portion 1120. For these examples, each of the entries 0-2 will be used to recover from the read error before entries 3 or 4 are used. Also, entries 5-6 included in portion 1120 will be the last entries used to recover from the read error.

In some examples, as shown in FIG. 11, each entry of MRR table 1100 has an initial count of 16. For these examples, a respective count for an MRR entry may be incremented when the MRR entry successfully recovers from a read error. The respective count for the MRR entry may be decremented when the MRR entry is determined to have the worst error correction capability.

According to some examples, as shown in FIG. 11, MRR table 1100 may have counts for MRR entries 0-6 updated following successful use of MRR entry 4 to recover from a read error. Also, for these examples, it may have determined that MRR entry 0 had the worst error correction capability relative to at least MRR entries 1 and 2 of portion 1110. Worst error correction capability may be determined based on counting a number of ECC codewords that pass ECC decoding or counting a number of bit errors correctly recovered from the read error. Thus, for the example shown in FIG. 11, MRR entry 0 may have been determined to have the worst error correction of portion 1110 based on the lowest number of ECC codewords that passed ECC decoding or the lowest number of bit errors correctly recovered.

In some examples, as shown in FIG. 11, reordered MRR table 1100 shows that the count for MRR entry 0 has been decremented to 15 and as a result of having the lowest count, MRR entry 0 is moved to the bottom of reordered MRR table 1100. Also, the count for MRR entry 4 was incremented due to the success of this entry in recovering from the read error. However, MRR entry 4 is only reordered within portion 1120 and prevented from moving to the top of reordered MRR table 1100. Rather, MRR entry 1 is moved to the top and MRR entry 1 will be the first entry used to recovery from another or subsequent read error. Also, MRR entry 5 is permitted to move above MRR entry 4 even though MRR entry 5 has a lower count than MRR entry 4. This move of MRR entry 5 may help to prevent the better corrective capability for read types such as SBR or CR from blocking propagation of MRR entries from portion 1110 that may have lower corrective capabilities but may have more desirable latencies and less overhead.

According to some examples, the CR read type for MRR entry 4 and the SBR read type for MRR entry 3 may obtain their center read reference values from the most successful MRR entries used before them to recover from the read error. As shown in FIG. 11, the entries used before were MRR entries 0-2. Also, as mentioned above, MRR entry 0 had the worst error correction capability. So the better error correction capability between MRR entries 1 and 2 may be determined and the MRR value for the MRR entry having the better error correction capability may be used as the center read reference value for the CR/SBR read types in MRR entries 4/3 for reordered MRR table 1100.

Figure 12:
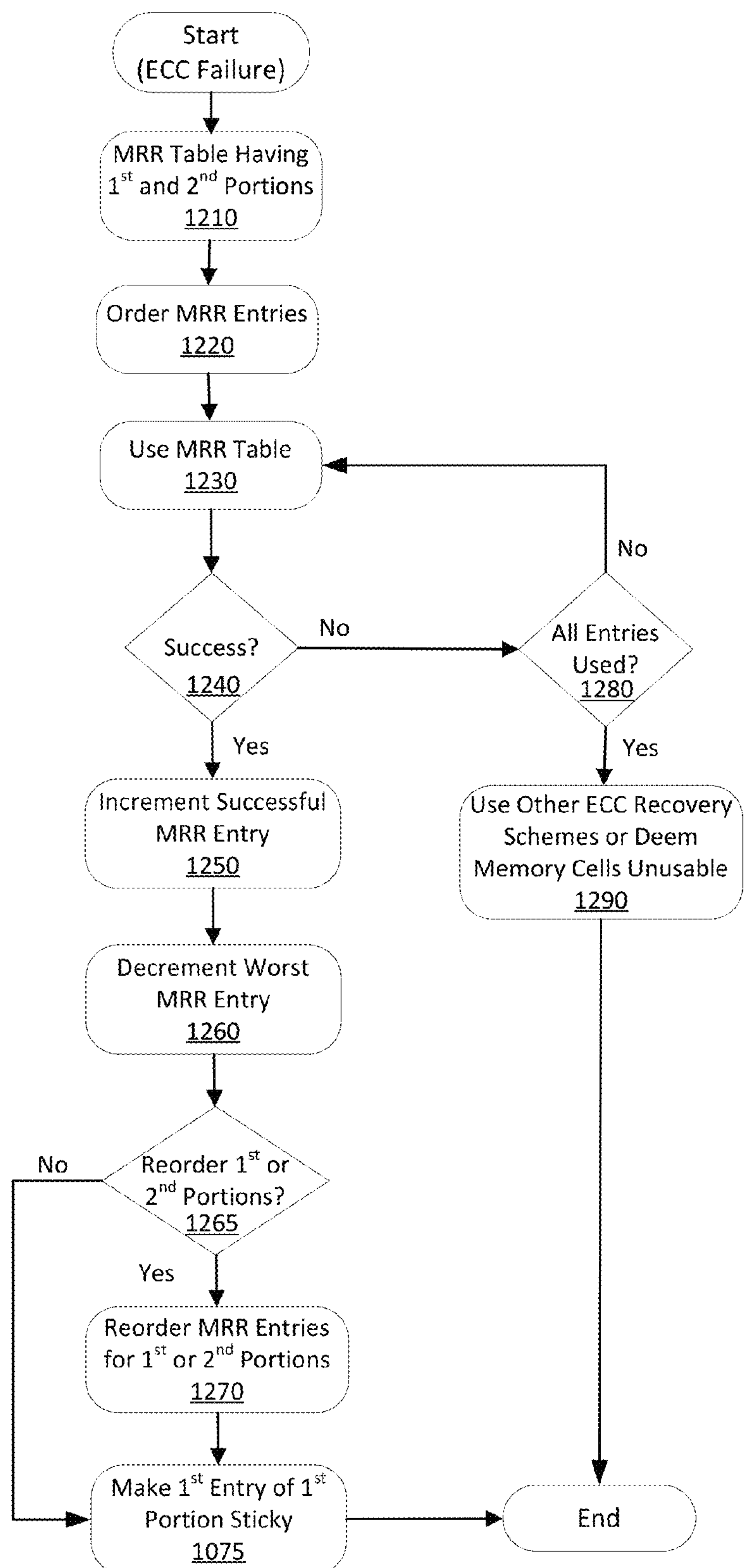
FIG. 12 illustrate a flow chart of example operations to reorder an MRR table.

FIG. 12 illustrates a flow chart of example operations to reorder an MRR table. In some examples, elements of SSD memory system 100 as shown in FIG. 1 may be used to illustrate example operations related to the flow chart depicted in FIG. 12. Priority manager 112 as shown in FIG. 1 and FIG. 2 may also be used to illustrate the example operations. MRR table 1100 shown in FIG. 11 may also be used to illustrate the example operations. But the described example operations are not limited to the elements described in FIGS. 1-2 such as SSD memory system 100, priority manager 112 or the MRR table 1100 shown in FIG. 11.

In some examples, as shown in FIG. 12, responsive to an ECC failure to recover from a read error of one or memory cells of non-volatile memory 130, the process moves from the start to block 1210 (MRR Table Having 1$^{st}$ and 2$^{nd}$ Portions), priority manager 112 may include logic and/or features to provide an MRR table such as MRR table 1100 for recovering from the read error. MRR table 1100, as mentioned above for FIG. 11, may have a portion 1110 having normal read types (single MRR values) and a portion 1120 having read types such as CR or SBR (multiple MRR values).

Proceeding from block 1210 to block 1220 (Order MRR Entries), priority manager 112 may include logic and/or features to order MRR entries of table 1100 such that at least one entry of portion 1110 will be used before (placed at the top) one or more entries of portion 1120 to recover from the read error.

Proceeding from block 1220 to block 1230 (Use MRR Table), controller 110 of non-volatile memory 130 priority manager 112 may be capable of using MRR table 1100 to recover from the read error.

Proceeding from block 1230 to decision block 1240 (Success?), controller 110 may be capable of determining whether a given entry from table 1100 successfully recovered from the read error. If success, the process moves to block 1250. Otherwise, the process moves to decision block 1280.

Moving from decision block 1240 to block 1250 (Increment Count for Successful MRR Entry), priority manager 112 may include logic and/or features to increment a count for the MRR entry of table 1100 that was used by controller 110 to successfully recovered from the read error.

Proceeding from block 1250 to block 1260 (Decrement Worst MRR Entry), priority manager 112 may include logic and/or features to decrement a count for an MRR entry of table 1100 that had the worst error correction capability. In some examples, the worst error correction capability may be an MRR entry from among those entries included in portion 1110. For these examples, the worst MRR entry from portion 1110 may be decremented.

Proceeding from block 1260 to decision block 1265 (Reorder 1$^{st}$ or 2$^{nd}$ Portions?), priority manager 112 may include logic and/or features to determine whether the MRR entries in portion 1110 or portion 1120 need to be reordered. No reordering may be needed if the relative count hierarchy remained unchanged following incrementing/decrementing of MRR entries included in each portion. If reordering, the process moves to block 1070. Otherwise, the process moves to block 1075.

Moving from decision block 1265 to block 1270 (Reorder MRR Entries for 1$^{st}$ or 2$^{nd}$ Portions), priority manager 112 may include logic and/or features to reorder MRR entries for portions 1110 or 1120. According to some examples, if portion 1110 is reordered, the MRR entries of portion 1110 having the highest count will be the first to be used to recover from another read error of the one or more memory cells of non-volatile memory 130. The MRR entry of portion 1110, for these examples, will also be used even before the MRR entries of portion 1120 that may have a higher count.

Proceeding from block 1270 to block 1275 (Make 1$^{st}$ Entry of 1$^{st}$ Portion Sticky), priority manager 112 may include logic and/or features to make the MRR entry from portion 1110 sticky for use as a read reference value to read values maintained in memory cells of non-volatile memory 130. Making this MRR entry sticky may help to prevent repeated and frequent use of MRR table 1100 by controller 110. The process may then come to an end.

Moving from decision block 1240 to decision block 1280 (All entries Used?), controller 110 may continue to use MRR entries in MRR table 1100 to attempt to recover from the read error. If all entries have be used and the read error was not successfully recovered for any of the MRR entries of MRR table 1100, the process moves to block 1290. Otherwise, the process moves to block 1230.

Moving from decision block 1280 to block 1290 (Use Other ECC Recovery Schemes or Deem Memory Cells Unstable), controller 110 may be capable of determining that MRR values have failed for all entries in MRR table 1100. In some examples, controller 110 may be arranged to either implement other ECC recovery schemes or may deem the one or memory cells of non-volatile memory 130 as unusable or unreadable. The process then comes to an end.

Figure 13:
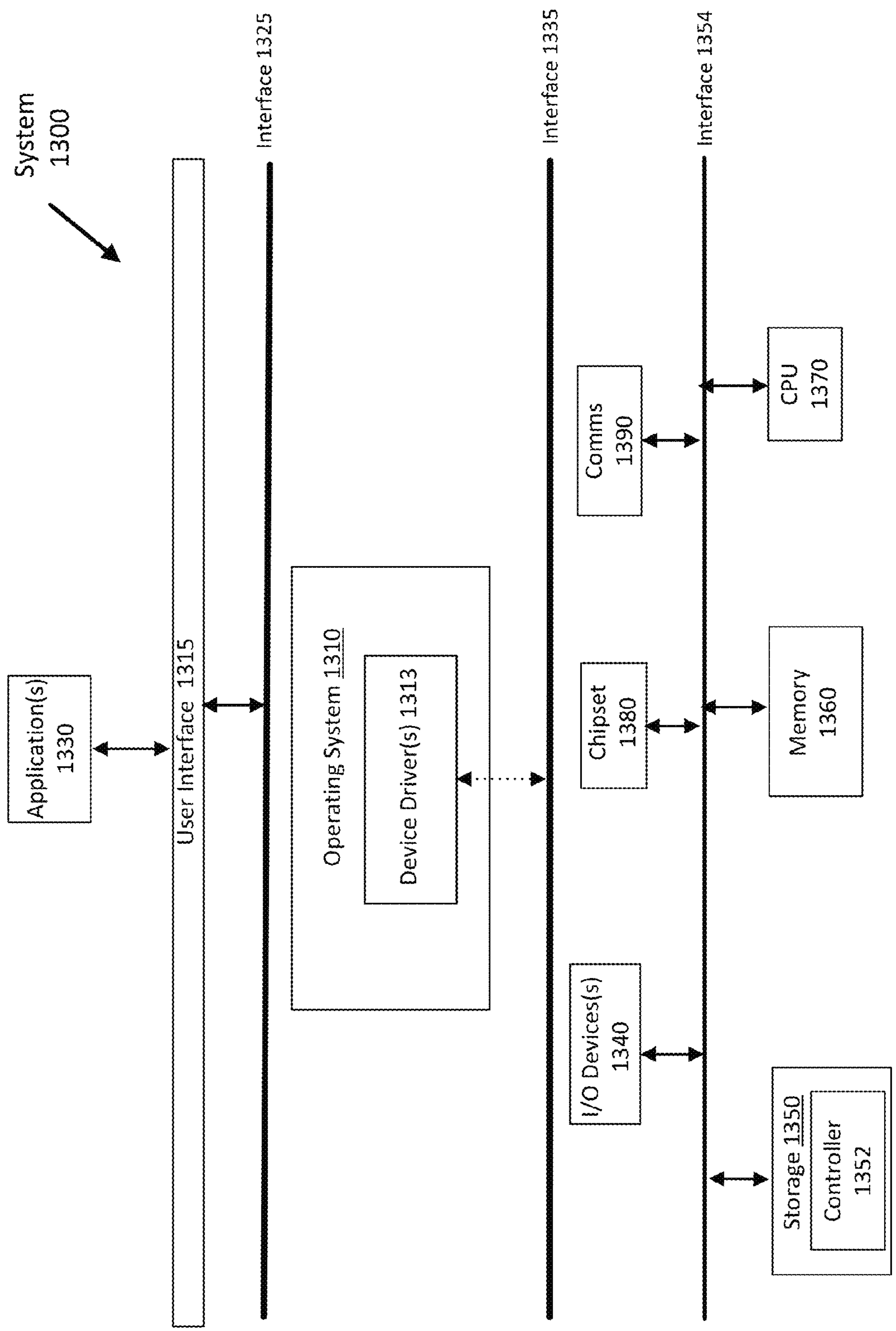
FIG. 13 illustrates an example system.

FIG. 13 illustrates an example system 1300. As shown in FIG. 13, system 1300 includes an operating system 1310, application(s) 1330, an input/output (I/O) device(s) 1340, a storage 1350, a memory 1360, a central processing unit (CPU) 1370, a chipset 1380, and communications (Comms) 1390. According to some examples, several interfaces are also depicted in FIG. 13 for interconnecting and/or communicatively coupling elements of system 1300. For example, user interface 1315 and interface 1325 may allow for users (not shown) and/or application(s) 1330 to couple to operating system 1310. Also, interface 1335 may allow for elements of operating system 1310 (e.g., device driver(s) 1312) to communicatively couple to elements of system 1300 such as I/O device(s) 1340, storage 1350, memory 1360, CPU 1370, chipset 1380 or comms 1390. Interface 1354, for example, may allow hardware and/or firmware elements of system 1300 to communicatively couple together, e.g., via a system bus or other type of internal communication channel.

In some examples, application(s) 1330 may include applications that may be implemented on system 1300. For these examples, applications(s) 1330 may request access or use of elements of system 1300 such as storage 1350 or memory 1360.

According to some examples, as shown in FIG. 13, operating system 1310 may include device driver(s) 1312. Device driver(s) 1312 may include logic and/or features configured to interact with hardware/firmware type elements of system 1300 (e.g., via interface 1335). For example, device driver(s) 1312 may include device drivers to control or direct storage 1350 or memory 1360 to fulfill requests made by application(s) 1330 or operating system 1310.

Although not shown, system 1300 may include various interface circuits, such as an Ethernet interface and/or a Universal Serial Bus (USB) interface, and/or the like. In some examples, I/O device(s) 1340 may include one or more input devices connected to interface circuits for entering data and commands to be implemented by elements of system 1300. For example, the input devices may include a keyboard, mouse, touch screen, track pad, track ball, isopoint, a voice recognition system, and/or the like. Similarly, the I/O device(s) 1340 may include one or more output devices connected to the interface circuits for outputting information to an operator. For example, the output devices may include one or more displays, printers, speakers, and/or other output devices, if desired. For example, one of the output devices may be a display. The display may be a cathode ray tube (CRTs), liquid crystal displays (LCDs), or any other type of display.

In some examples, storage 1350 may include various types of memory configured to be implemented or operated in a storage mode of operation. Storage 1350 may include at least one or a combination of different types of storage devices to store relatively large amounts of data. These different types of storage devices may include, but are not limited to, one or more of a magnetic disk drive, an optical disk drive, a tape drive, an internal storage device, an attached storage device, flash memory, battery backed-up SDRAM (synchronous DRAM), a network accessible storage device, and/or other types of non-volatile memory (e.g., phase change material (PCM)).

As shown in FIG. 13, storage 1350 also includes a controller 1352 to facilitate control or access to the memory maintained at storage 1350. In some examples, controller 1352 may include a priority manager similar to priority manager 112 described above. For these examples, at least some of the types of memory included at storage 1350 may include non-volatile memory that may include but not limited to, 3-dimensional cross-point memory, flash memory (e.g., NAND memory), ferroelectric memory, silicon-oxide-nitride-oxide-silicon (SONOS) memory, polymer memory, nanowire, ferroelectric transistor random access memory (FeTRAM or FeRAM), nanowire or electrically erasable programmable read-only memory (EEPROM). The priority manager included in controller 1352 may provide/update an MRR table to be used to recover from read errors of memory cells of the non-volatile memory. In other examples, chipset 1380 may include a controller to facilitate control or access to storage 1350 and a priority manager may be included in that controller.

According to some examples, memory 1360 may include types of memory configured to be implemented or operated in a memory mode of operation. In a memory mode of operation, memory 1360 may be utilized by various elements of system 1300 (e.g., as off-chip memory). For these implementations, memory 1360 may include at least one or a combination of different types of memory to include random access memory (RAM), dynamic random access memory (DRAM), static RAM (SRAM), phase change material RAM (PRAM), or types of non-volatile memory to include NOR memory.

According to some examples, CPU 1370 may be implemented as a central processing unit for system 1300. CPU 1370 may include one or more processing units or elements having one or more processor cores or having any number of processors having any number of processor cores. CPU 1370 may include any type of processing unit, such as, for example, a multi-processing unit, a reduced instruction set computer (RISC), a processor having a pipeline, a complex instruction set computer (CISC), digital signal processor (DSP), and so forth.

In some examples, chipset 1380 may provide intercommunication among operating system 1310, I/O device(s) 1340, storage 1350, memory 1360, CPU 1370 or comms 1390. For example, chipset 1380 may provide intercommunication between operating system 1310, I/O device(s) 1340, storage 1350 and CPU 1370 to retrieve information from storage 1350 to display graphics on a display included with I/O device(s) 1340 that were rendered by CPU 1370 at the request of operating system 1310.

In some examples, comms 1390 may include logic and/or features to enable system 1300 to communicate externally with elements remote to system 1300. These logic and/or features may include communicating over wired and/or wireless communication channels or connections via one or more wired or wireless networks. In communicating across such networks, comms 1390 may operate in accordance with one or more applicable communication or networking standards in any version.

As mentioned above, interface 1354, may allow hardware and/or firmware elements of system 1300 to communicatively couple together. According to some examples, communication channels interface 1354 may operate in accordance with one or more protocols or standards. These protocols or standards may be described in one or one or more industry standards (including progenies and variants) such as those associated with the Peripheral Component Interconnect (PCI) Express Base Specification ("PCI Express" or "PCIe"), the Non-Volatile Memory Express (NVMe) Specification, the Open NAND Flash Interface Specification (ONFi), the Inter-Integrated Circuit ($I^2C$) specification, the System Management Bus (SMBus) specification, the Accelerated Graphics Port (AGP) specification, the Peripheral Component Interconnect Express (PCI Express) specification, the Universal Serial Bus (USB), specification or the Serial Advanced Technology Attachment (SATA) specification. Although this disclosure is not limited to only the above-mentioned standards and associated protocols.

In some examples, system 1300 may be included in a computing device. Examples of a computing device may include a server, a desktop computer, a personal computer (PC), laptop computer, an ultra-mobile computer, a tablet, a touch pad, a portable computer, a handheld computer, a palmtop computer, a personal digital assistant (PDA), a cellular telephone, combination cellular telephone/PDA, a television, a smart device (e.g., smart phone, smart tablet or smart television), a mobile internet device (MID), a messaging device, a data communication device, and so forth.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

Some examples may include an article of manufacture. An article of manufacture may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof.

According to some examples, an article of manufacture may include a non-transitory storage medium to store or maintain instructions that when executed by a computer or system, cause the computer or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a computer to perform a certain function. The instructions may be implemented using any suitable high-level, low-level, object-oriented, visual, compiled and/or interpreted programming language.

Some examples may be described using the expression "in one example" or "an example" along with their derivatives. These terms mean that a particular feature, structure, or characteristic described in connection with the example is included in at least one example. The appearances of the phrase "in one example" in various places in the specification are not necessarily all referring to the same example.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The follow examples pertain to additional examples of technologies disclosed herein.

Example 1

An Example method may include providing a moving read reference (MRR) table for recovering from a read error of one or more memory cells of a non-volatile memory included in a storage device. The MRR table may include a first and a second portion of entries. The first portion may include entries each having a single MRR value for each read reference value. The second portion may include one or more entries each having multiple MRR values for each read reference value. The method may also include ordering the MRR table entries such that at least one entry of the first portion is used before one or more entries of the second portion when the MRR table is used to recover from a read error of the one or more memory cells. The method may also include using one or more entries of the MRR table to recover from one or more read errors of the one or more memory cells. The method may also include decrementing a first count for a first entry of the first portion based on the entry having a worst error correction capability relative to one or more other entries of the first portion. The method may also include reordering the MRR table entries of the first portion such that a given entry of the first portion having a highest count will be first from among the first portion of entries to be used to recover from another read error of the one or more memory cells, the given entry also used before any of the one or more entries of the second portion.

Example 2

The method of example 1, determining error correction capability may be based on counting a number of error correction code (ECC) codewords that pass ECC decoding or counting a number of bit errors correctly recovered from the one or more read errors, the entry having the worst error correction having the lowest number of ECC codewords that passed ECC decoding or the lowest number of bit errors correctly recovered.

Example 3

The method of example 1 may also include incrementing a second count for a second entry based on the second entry successfully recovering from the one or more read errors, the second entry included in the first or second portion of entries.

Example 4

The method of example 3, the second entry may be included in the second portion of entries. The method may also include reordering the MRR table entries of the second portion such that a given entry of the second portion having a highest count will be first among the second portion of entries to be used to recover from another read error of the one or more memory cells.

Example 5

The method of example 3, the one or more entries of the second portion may include use of a corrective read (CR), a soft-bit read (SBR) or use of a combination of CR and SBR to recover from the one or more read errors.

Example 6

The method of example 5, the second portion including one or more entries each having multiple MRR values for each read reference value may include the multiple MRR values having a center read reference value, the center read reference value updated based on an MRR value used with the second entry to successfully recover from the one or more read errors.

Example 7

The method of example 1, the one or more memory cells of the non-volatile memory may be arranged as NAND flash memory and the storage device may include a solid state drive.

Example 8

The method of example 1, the one or more memory cells of the non-volatile memory may include at least one of 3-dimensional cross-point memory, flash memory, ferroelectric memory, silicon-oxide-nitride-oxide-silicon (SONOS) memory, polymer memory, nanowire, ferroelectric transistor random access memory (FeTRAM or FeRAM), nanowire or electrically erasable programmable read-only memory (EEPROM) and the storage device is a solid state drive.

Example 9

An Example at least one machine readable medium may include a plurality of instructions that in response to being executed on a computing device cause the computing device to carry out a method according to any one of examples 1 to 8.

Example 10

An Example apparatus may include means for performing the method of any one of examples 1 to 8.

Example 11

An Example apparatus may include a processor circuit. The apparatus may also include a memory unit communicatively coupled to the processor circuit. The memory unit may be arranged to store instructions for logic operative on the processor circuit. For these examples the logic may provide a moving read reference (MRR) table for recovering from a read error of one or more memory cells of a non-volatile memory included in a storage device. The MRR table may include a first and a second portion of entries. The first portion may include entries each having a single MRR value for each read reference value. The second portion may include one or more entries each having multiple MRR values for each read reference value. The logic may also order the MRR table entries such that at least one entry of the first portion is used before one or more entries of the second portion when the MRR table is used to recover from a read error of the one or more memory cells. The logic may also use one or more entries of the MRR table to recover from one or more read errors of the one or more memory cells. The logic may also decrement a first count for a first entry of the first portion based on the entry having a worst error correction capability relative to one or more other entries of the first portion. The logic may also reorder the MRR table entries of the first portion such that a given entry of the first portion having a highest count will be first from among the first portion of entries to be used to recover from another read error of the one or more memory cells, the given entry also used before any of the one or more entries of the second portion.

Example 12

The apparatus of example 11, error correction capability may be determined based on the logic arranged to count a number of error correction code (ECC) codewords that pass ECC decoding or arranged to count a number of bit errors correctly recovered from the one or more read errors, the entry having the worst error correction having the lowest number of ECC codewords that passed ECC decoding or the lowest number of bit errors correctly recovered.

Example 13

The apparatus of example 11, the logic may also increment a second count for a second entry based on the second entry successfully recovering from the one or more read errors, the second entry included in the first or second portion of entries.

Example 14

The apparatus of example 13, the second entry may be included in the second portion of entries. For these examples the logic may also reorder the MRR table entries of the second portion such that a given entry of the second portion having a highest count will be first among the second portion of entries to be used to recover from another read error of the one or more memory cells.

Example 15

The apparatus of example 13, the one or more entries of the second portion may include use of a corrective read (CR), a soft-bit read (SBR) or use of a combination of CR and SBR to recover from the one or more read errors.

Example 16

The apparatus of example 15, the second portion may include one or more entries each having multiple MRR values for each read reference value comprises the multiple MRR values having a center read reference value. For these examples, the center read reference value may be updated based on an MRR value used with the second entry to successfully recover from the one or more read errors.

Example 17

The apparatus of example 11, the one or more memory cells of the non-volatile memory may be arranged as NAND flash memory and the storage device may include a solid state drive.

Example 18

The apparatus of example 11, the one or more memory cells of the non-volatile memory may include at least one of 3-dimensional cross-point memory, flash memory, ferroelectric memory, silicon-oxide-nitride-oxide-silicon (SONOS) memory, polymer memory, nanowire, ferroelectric transistor random access memory (FeTRAM or FeRAM), nanowire or electrically erasable programmable read-only memory (EEPROM) and the storage device is a solid state drive.

Example 19

The apparatus of example 11 may also include a display coupled to the processor circuit to present a user interface view.

Example 20

An Example at least one machine readable medium may include a plurality of instructions that in response to being executed on a controller for a storage device may cause the controller to provide a moving read reference (MRR) table for recovering from a read error of one or more memory cells of a non-volatile memory included in the storage device. The MRR table may include a first and a second portion of entries. The first portion may include entries each having a single MRR value for each read reference value. The second portion may include one or more entries each having multiple MRR values for each read reference value. The instructions may also cause the controller to order the MRR table entries such that at least one entry of the first portion is used before one or more entries of the second portion when the MRR table is used to recover from a read error of the one or more memory cells. The instructions may also cause the controller to use one or more entries of the MRR table to recover from one or more read errors of the one or more memory cells. The instructions may also cause the controller to decrement a first count for a first entry of the first portion based on the entry having a worst error correction capability relative to one or more other entries of the first portion. The instructions may also cause the controller to reorder the MRR table entries of the first portion such that a given entry of the first portion having a highest count will be first from among the first portion of entries to be used to recover from another read error of the one or more memory cells. The given entry may also be used before any of the one or more entries of the second portion.

Example 21

The at least one machine readable medium of example 20, the instructions to may also cause the controller to determine error correction capability based on counting a number of error correction code (ECC) codewords that pass ECC decoding or counting a number of bit errors correctly recovered from the one or more read errors. For these examples, the entry having the worst error correction may have the lowest number of ECC codewords that passed ECC decoding or the lowest number of bit errors correctly recovered.

Example 22

The at least one machine readable medium of example 20, the instructions to may also cause the controller to increment a second count for a second entry based on the second entry successfully recovering from the one or more read errors, the second entry included in the first or second portion of entries.

Example 23

The at least one machine readable medium of example 22, the second entry included in the second portion of entries. For these examples, the instructions may also cause the controller to reorder the MRR table entries of the second portion such that a given entry of the second portion having a highest count will be first among the second portion of entries to be used to recover from another read error of the one or more memory cells.

Example 24

The least one machine readable medium of example 22, the one or more entries of the second portion may include use of a corrective read (CR), a soft-bit read (SBR) or use of a combination of CR and SBR to recover from the one or more read errors.

Example 25

The at least one machine readable medium of example 24, the second portion including one or more entries each having multiple MRR values for each read reference value comprises the multiple MRR values having a center read reference value, the center read reference value updated based on an MRR value used with the second entry to successfully recover from the one or more read errors.

It is emphasized that the Abstract of the Disclosure is provided to comply with 37 C.F.R. Section 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single example for the purpose of streamlining the disclosure. This method of disclosure is not to be interpreted as reflecting an intention that the claimed examples require more features than are expressly recited in each claim. Rather, as the following claims reflect, inventive subject matter lies in less than all features of a single disclosed example. Thus the following claims are hereby incorporated into the Detailed Description, with each claim standing on its own as a separate example. In the appended claims, the terms "including" and "in which" are used as the plain-English equivalents of the respective terms "comprising" and "wherein," respectively. Moreover, the terms "first," "second," "third," and so forth, are used merely as labels, and are not intended to impose numerical requirements on their objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method comprising:

providing a moving read reference (MRR) table for recovering from a read error of one or more memory cells of a non-volatile memory included in a storage device, the MRR table including a first and a second portion of entries, the first portion including entries each having a single MRR value for each read reference value, the second portion including one or more entries each having multiple MRR values for each read reference value;

ordering the MRR table entries such that at least one entry of the first portion is used before one or more entries of the second portion when the MRR table is used to recover from a read error of the one or more memory cells;

using one or more entries of the MRR table to recover from one or more read errors of the one or more memory cells;

decrementing a first count for a first entry of the first portion based on the entry having a worst error correction capability relative to one or more other entries of the first portion; and reordering the MRR table entries of the first portion such that a given entry of the first portion having a highest count will be first from among the first portion of entries to be used to recover from another read error of the one or more memory cells, the given entry also used before any of the one or more entries of the second portion.

2. The method of claim 1, comprising determining error correction capability based on counting a number of error correction code (ECC) codewords that pass ECC decoding or counting a number of bit errors correctly recovered from the one or more read errors, the entry having the worst error correction having the lowest number of ECC codewords that passed ECC decoding or the lowest number of bit errors correctly recovered.

3. The method of claim 1, comprising:

incrementing a second count for a second entry based on the second entry successfully recovering from the one or more read errors, the second entry included in the first or second portion of entries.

4. The method of claim 3, comprising:

the second entry included in the second portion of entries; and reordering the MRR table entries of the second portion such that a given entry of the second portion having a highest count will be first among the second portion of entries to be used to recover from another read error of the one or more memory cells.

5. The method of claim 3, the one or more entries of the second portion include use of a corrective read (CR), a soft-bit read (SBR) or use of a combination of CR and SBR to recover from the one or more read errors.

6. The method of claim 5, the second portion including one or more entries each having multiple MRR values for each read reference value comprises the multiple MRR values having a center read reference value, the center read reference value updated based on an MRR value used with the second entry to successfully recover from the one or more read errors.

7. The method of claim 1, the one or more memory cells of the non-volatile memory arranged as NAND flash memory and the storage device comprising a solid state drive.

8. The method of claim 1, the one or more memory cells of the non-volatile memory comprising at least one of 3-dimensional cross-point memory, flash memory, ferroelectric memory, silicon-oxide-nitride-oxide-silicon (SONOS) memory, polymer memory, nanowire, ferroelectric transistor random access memory (FeTRAM or FeRAM), nanowire or electrically erasable programmable read-only memory (EEPROM) and the storage device is a solid state drive.

9. An apparatus comprising:

a processor circuit; and a memory unit communicatively coupled to the processor circuit, the memory unit arranged to store instructions for logic operative on the processor circuit, the logic to:

provide a moving read reference (MRR) table for recovering from a read error of one or more memory cells of a non-volatile memory included in a storage device, the MRR table including a first and a second portion of entries, the first portion including entries each having a single MRR value for each read reference value, the second portion including one or more entries each having multiple MRR values for each read reference value;

order the MRR table entries such that at least one entry of the first portion is used before one or more entries of the second portion when the MRR table is used to recover from a read error of the one or more memory cells;

use one or more entries of the MRR table to recover from one or more read errors of the one or more memory cells;

decrement a first count for a first entry of the first portion based on the entry having a worst error correction capability relative to one or more other entries of the first portion; and reorder the MRR table entries of the first portion such that a given entry of the first portion having a highest count will be first from among the first portion of entries to be used to recover from another read error of the one or more memory cells, the given entry also used before any of the one or more entries of the second portion.

10. The apparatus of claim 9, comprising error correction capability determined based on the logic arranged to count a number of error correction code (ECC) codewords that pass ECC decoding or count a number of bit errors correctly recovered from the one or more read errors, the entry having the worst error correction having the lowest number of ECC codewords that passed ECC decoding or the lowest number of bit errors correctly recovered.

11. The apparatus of claim 10, comprising the logic to:

increment a second count for a second entry based on the second entry successfully recovering from the one or more read errors, the second entry included in the first or second portion of entries.

12. The apparatus of claim 11, comprising the second entry included in the second portion of entries, the logic to reorder the MRR table entries of the second portion such that a given entry of the second portion having a highest count will be first among the second portion of entries to be used to recover from another read error of the one or more memory cells.

13. The apparatus of claim 11, the one or more entries of the second portion include use of a corrective read (CR), a soft-bit read (SBR) or use of a combination of CR and SBR to recover from the one or more read errors.

14. The apparatus of claim 13, the second portion including one or more entries each having multiple MRR values for each read reference value comprises the multiple MRR values having a center read reference value, the center read reference value updated based on an MRR value used with the second entry to successfully recover from the one or more read errors.

15. The apparatus of claim 13, the one or more memory cells of the non-volatile memory arranged as NAND flash memory and the storage device comprising a solid state drive.

16. The apparatus of claim 9, the one or more memory cells of the non-volatile memory comprising at least one of 3-dimensional cross-point memory, flash memory, ferroelectric memory, silicon-oxide-nitride-oxide-silicon (SONOS) memory, polymer memory, nanowire, ferroelectric transistor random access memory (FeTRAM or FeRAM), nanowire or electrically erasable programmable read-only memory (EEPROM) and the storage device is a solid state drive.

17. The apparatus of claim 9, comprising a display coupled to the processor circuit to present a user interface view.

18. At least one non-transitory machine readable medium comprising a plurality of instructions that in response to being executed on a controller for a storage device cause the controller to:

provide a moving read reference (MRR) table for recovering from a read error of one or more memory cells of a non-volatile memory included in the storage device, the MRR table including a first and a second portion of entries, the first portion including entries each having a single MRR value for each read reference value, the second portion including one or more entries each having multiple MRR values for each read reference value;

order the MRR table entries such that at least one entry of the first portion is used before one or more entries of the second portion when the MRR table is used to recover from a read error of the one or more memory cells;

use one or more entries of the MRR table to recover from one or more read errors of the one or more memory cells;

decrement a first count for a first entry of the first portion based on the entry having a worst error correction capability relative to one or more other entries of the first portion; and reorder the MRR table entries of the first portion such that a given entry of the first portion having a highest count will be first from among the first portion of entries to be used to recover from another read error of the one or more memory cells, the given entry also used before any of the one or more entries of the second portion.

19. The at least one non-transitory machine readable medium of claim 18, the instructions to further cause the controller to:

determine error correction capability based on counting a number of error correction code (ECC) codewords that pass ECC decoding or counting a number of bit errors correctly recovered from the one or more read errors, the entry having the worst error correction having the lowest number of ECC codewords that passed ECC decoding or the lowest number of bit errors correctly recovered.

20. The at least one non-transitory machine readable medium of claim 18, the instructions to further cause the controller to:

increment a second count for a second entry based on the second entry successfully recovering from the one or more read errors, the second entry included in the first or second portion of entries.

21. The at least one non-transitory machine readable medium of claim 20, comprising the second entry included in the second portion of entries, the instructions to further cause the controller to:

reorder the MRR table entries of the second portion such that a given entry of the second portion having a highest count will be first among the second portion of entries to be used to recover from another read error of the one or more memory cells.

22. The at least one non-transitory machine readable medium of claim 20, the one or more entries of the second portion include use of a corrective read (CR), a soft-bit read (SBR) or use of a combination of CR and SBR to recover from the one or more read errors.

23. The at least one non-transitory machine readable medium of claim 22, the second portion including one or more entries each having multiple MRR values for each read reference value comprises the multiple MRR values having a center read reference value, the center read reference value updated based on an MRR value used with the second entry to successfully recover from the one or more read errors.

* * * * *